(12) United States Patent
Ishida et al.

(10) Patent No.: US 10,141,368 B2
(45) Date of Patent: Nov. 27, 2018

(54) SEMICONDUCTOR DEVICE

(71) Applicant: HAMAMATSU PHOTONICS K.K., Hamamatsu-shi, Shizuoka (JP)

(72) Inventors: Atsushi Ishida, Hamamatsu (JP); Noburo Hosokawa, Hamamatsu (JP); Terumasa Nagano, Hamamatsu (JP); Takashi Baba, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/561,992

(22) PCT Filed: Mar. 31, 2016

(86) PCT No.: PCT/JP2016/060838
§ 371 (c)(1),
(2) Date: Sep. 27, 2017

(87) PCT Pub. No.: WO2016/159322
PCT Pub. Date: Oct. 6, 2016

(65) Prior Publication Data
US 2018/0069145 A1 Mar. 8, 2018

(30) Foreign Application Priority Data
Mar. 31, 2015 (JP) .................................. 2015-070697

(51) Int. Cl.
*H01L 31/107* (2006.01)
*H01L 27/146* (2006.01)
(Continued)

(52) U.S. Cl.
CPC .... *H01L 27/14687* (2013.01); *H01L 21/3205* (2013.01); *H01L 21/768* (2013.01);
(Continued)

(58) Field of Classification Search
CPC . H01L 2224/02372; H01L 2224/13025; H01L 21/76802; H01L 21/76843;
(Continued)

(56) References Cited

U.S. PATENT DOCUMENTS 9,601,426 B1 * 3/2017 Bonilla ............... H01L 23/5283
9,659,980 B2 * 5/2017 McGarvey .......... H01L 27/1446
(Continued)

FOREIGN PATENT DOCUMENTS

EP     1519410     3/2005
EP     2802005     11/2014
(Continued)

OTHER PUBLICATIONS

International Preliminary Report on Patentability dated Oct. 12, 2017 for PCT/JP2016/060838.
(Continued)

*Primary Examiner* — Edward Chin
(74) *Attorney, Agent, or Firm* — Drinker Biddle & Reath LLP

(57) ABSTRACT

In a plane including the center line of a vertical through hole, it is assumed that a segment that connects a first point corresponding to the edge of an opening of an insulating layer and a second point corresponding to the edge of a second opening is a first segment, a segment that connects the second point and a third point corresponding to an intersection point between the second opening and a surface of the insulating layer is a second segment, and a segment that connects the third point and the first point is a third segment. In the insulating layer, the first area located on one side with respect to the first segment is larger than the sum of the second area surrounded by the first, the second and the third segments and the third area located on the other side with respect to the third segment.

10 Claims, 17 Drawing Sheets

(51) Int. Cl.

| | |
|---|---|
| *H01L 21/3205* | (2006.01) |
| *H01L 23/522* | (2006.01) |
| *H01L 23/532* | (2006.01) |
| *H01L 21/768* | (2006.01) |
| *H01L 23/00* | (2006.01) |
| *H01L 31/02* | (2006.01) |
| *H01L 31/0216* | (2014.01) |
| *H01L 23/48* | (2006.01) |
| *H01L 31/0203* | (2014.01) |
| *H01L 31/103* | (2006.01) |

(52) U.S. Cl.
CPC ...... *H01L 21/76898* (2013.01); *H01L 23/481* (2013.01); *H01L 23/522* (2013.01); *H01L 23/532* (2013.01); *H01L 24/02* (2013.01); *H01L 24/13* (2013.01); *H01L 27/14632* (2013.01); *H01L 27/14636* (2013.01); *H01L 27/14643* (2013.01); *H01L 31/02005* (2013.01); *H01L 31/02161* (2013.01); *H01L 31/107* (2013.01); *H01L 31/0203* (2013.01); *H01L 31/103* (2013.01); *H01L 2224/0233* (2013.01); *H01L 2224/0235* (2013.01); *H01L 2224/0236* (2013.01); *H01L 2224/02371* (2013.01); *H01L 2224/02372* (2013.01); *H01L 2224/02381* (2013.01); *H01L 2224/10126* (2013.01); *H01L 2224/11* (2013.01); *H01L 2224/12105* (2013.01); *H01L 2224/13009* (2013.01); *H01L 2224/13021* (2013.01); *H01L 2224/13024* (2013.01); *H01L 2224/13025* (2013.01); *H01L 2924/10253* (2013.01); *H01L 2924/12043* (2013.01); *H01L 2924/351* (2013.01)

(58) Field of Classification Search
CPC ......... H01L 21/76852; H01L 21/76877; Y10T 29/49165
See application file for complete search history.

(56) References Cited

U.S. PATENT DOCUMENTS

| | | | |
|---|---|---|---|
| 9,691,932 B2* | 6/2017 | Sasaki | ............... H01L 31/103 |
| 2009/0008566 A1* | 1/2009 | Agarwal | ........... H01L 27/14658 |
| | | | 250/370.11 |
| 2012/0068327 A1 | 3/2012 | Oganesian et al. | |
| 2012/0068330 A1 | 3/2012 | Oganesian et al. | |
| 2012/0205816 A1 | 8/2012 | Son et al. | |
| 2014/0131882 A1 | 5/2014 | Law et al. | |
| 2015/0096798 A1* | 4/2015 | Uzoh | ................ H05K 999/00 |
| | | | 174/267 |
| 2017/0236852 A1* | 8/2017 | McGarvey | .......... H01L 27/1446 |
| | | | 257/438 |

FOREIGN PATENT DOCUMENTS

| | | |
|---|---|---|
| JP | S59-126643 A | 7/1984 |
| JP | H2-268416 A | 11/1990 |
| JP | H4-014830 A | 1/1992 |
| JP | H7-321205 A | 12/1995 |
| JP | H08-330295 A | 12/1996 |
| JP | 2003-101222 A | 4/2003 |
| JP | 2004-057507 A | 2/2004 |
| JP | 2005-019521 | 1/2005 |
| JP | 2005-101268 | 4/2005 |
| JP | 2006-215062 A | 8/2006 |
| JP | 2007-105859 A | 4/2007 |
| JP | 2007-305955 A | 11/2007 |
| JP | 2008-277371 A | 11/2008 |
| JP | 2013-89918 A | 5/2013 |
| JP | 2013-89919 A | 5/2013 |

OTHER PUBLICATIONS

International Preliminary Report on Patentability dated Oct. 12, 2017 for PCT/JP2016/060837.
International Preliminary Report on Patentability dated Oct. 12, 2017 for PCT/JP2016/060834.
International Preliminary Report on Patentability dated Oct. 12, 2017 for PCT/JP2016/060832.

* cited by examiner

SEMICONDUCTOR DEVICE

TECHNICAL FIELD

The present invention relates to a semiconductor device.

BACKGROUND ART

For example, Patent Literature 1 discloses a semiconductor device including a semiconductor substrate on which a plurality of avalanche photodiodes that operate in a Geiger mode are provided and a mounting substrate on which a plurality of signal processing units that process an output signal from each avalanche photodiode are provided. In the semiconductor device disclosed in Patent Literature 1, a front surface side and a rear surface side of the semiconductor substrate are electrically connected to each other through a through hole formed in the semiconductor substrate.

CITATION LIST

Patent Literature

Patent Literature 1: Japanese Unexamined Patent Publication No. 2013-89919

SUMMARY OF INVENTION

Technical Problem

In the above-mentioned semiconductor device, it is preferable to increase the percentage of the area of a plurality of pixels (corresponding to avalanche photodiodes) in the light receiving surface. However, when a through hole is provided in each avalanche photodiode, it is desirable to reduce the percentage of the volume of the through holes in the semiconductor substrate. In addition, it is desirable to prevent, for example, the breaking of a wiring in the through hole and to reliably ensure an electrical connection through the through hole in the semiconductor substrate. In particular, in the above-mentioned semiconductor device, since an operating voltage applied to the avalanche photodiode is high, it is desirable to reliably insulate the wiring in the through hole from the semiconductor substrate.

Accordingly, an object of the invention is to provide a semiconductor device that can reliably ensure an electrical connection through a through hole in a semiconductor substrate while reducing the percentage of the volume of the through holes in the semiconductor substrate.

Solution to Problem

According to an aspect of the invention, there is provided a semiconductor device including: a semiconductor substrate that has first and second surfaces opposite to each other and in which a through hole to extend from the first surface to the second surface is formed; a first wiring that is provided on the first surface and has a portion located above a first opening of the through hole on the first surface side; an insulating layer that is provided on an inner surface of the through hole and the second surface and is continuous through a second opening of the through hole on the second surface side; and a second wiring that is provided on a surface of the insulating layer and is electrically connected to the first wiring in an opening on the first surface of the insulating layer. The through hole is a vertical hole. In a case in which attention is paid to regions on both sides of a center line of the through hole in a plane including the center line of the through hole, when a segment that connects a first point corresponding to an edge of the opening of the insulating layer and a second point corresponding to an edge of the second opening is a first segment, a segment that connects the second point and a third point corresponding to an intersection point between the second opening and the surface of the insulating layer is a second segment, and a segment that connects the third point and the first point is a third segment, a first area of the insulating layer that is located on the inner surface side of the through hole with respect to the first segment is larger than the sum of a second area of the insulating layer that is surrounded by the first segment, the second segment, and the third segment and a third area of the insulating layer that is located on the side opposite the inner surface of the through hole with respect to the third segment.

In the semiconductor device, the insulating layer is provided such that the first area is larger than the sum of the second area and the third area and the third area is present, when attention is paid to the regions on both sides of the center line of the through hole in the plane including the center line of the through hole. Therefore, the average inclination angle of the surface of a portion of the insulating layer which covers the edge of the second opening is small (that is, the surface is gentle) and the thickness of the portion is ensured. Therefore, when the through hole is a vertical hole, for example, the breaking of the second wiring and the leakage of a current between the second wiring and the semiconductor substrate which are likely to occur in the vicinity of the second opening are prevented. In addition, since the through hole is a vertical hole, the percentage of the volume of the through hole in the semiconductor substrate is less than that when the through hole is a tapered hole that gradually widens from the first surface to the second surface of the semiconductor substrate. The reason is that, when the area of the first opening of the through hole which needs to be minimized in order to connect the first wiring and the second wiring is constant, the vertical hole hardly becomes gradually wider from the first surface to the second surface of the semiconductor substrate while the tapered hole becomes gradually wider from the first surface to the second surface of the semiconductor substrate. As described above, according to the semiconductor device, it is possible to reliably ensure an electrical connection through the through hole in the semiconductor substrate while reducing the percentage of the volume of the through hole in the semiconductor substrate. In addition, the vertical hole means a through hole in which an angle formed between the inner surface of the through hole (when the inner surface of the through hole is a curved surface, such as a cylindrical surface, a plane tangent to the curved surface) and the first surface (that is, when attention is paid to the regions on both sides of the center line of the through hole in a plane including the center line of the through hole, the average value of the angle formed between the first surface and an intersection line between the plane and the inner surface of the through hole) is in the range of 80° to 100° (preferably, in the range of 85° to 95°).

In the semiconductor device according to the above-mentioned aspect of the invention, an inclination angle of the surface of the insulating layer at the first point may be greater than an inclination angle of the surface of the insulating layer at the third point. According to this structure, for example, even when the diameter of the through hole is reduced, it is possible to sufficiently ensure the size of the opening of the insulating layer in the first surface of the semiconductor substrate while maintaining the average inclination angle of the surface of a portion of the insulating layer, which covers the edge of the second opening, at a small value (that is, at a shallow angle). Therefore, it is possible to prevent the breaking of the second wiring in a portion of the insulating layer which covers the edge of the second opening and to prevent the breaking of the first wiring and the second wiring in the opening of the insulating layer.

In the semiconductor device according to the above-mentioned aspect of the invention, an average inclination angle of the surface of the insulating layer provided on the inner surface of the through hole may be less than an average inclination angle of the inner surface of the through hole. According to this structure, for example, it is possible to more easily and reliably form the second wiring from the second opening of the semiconductor substrate than that when the insulating layer is formed with a uniform thickness along the inner surface of the through hole. In addition, the average inclination angle of the inner surface of the through hole includes a case in which the inner surface of the through hole (when the inner surface of the through hole is a curved surface, such as a cylindrical surface, a plane tangent to the curved surface) is perpendicular to the first surface of the semiconductor substrate and the angle formed between the inner surface of the through hole and the first surface is 90°.

In the semiconductor device according to the above-mentioned aspect of the invention, when attention is paid to the regions on both sides of the center line of the through hole in the plane including the center line of the through hole, a distance between the first point and a fourth point corresponding to an edge of the first opening may be greater than a width of the opening of the insulating layer. For example, when the opening is formed in the insulating layer from the second opening of the semiconductor substrate, the opening of the insulating layer which is provided in the first surface is separated from the second surface of the semiconductor substrate. Therefore, for example, a variation in the size or position of the opening is likely to occur. Since the distance between the first point and the fourth point is greater than the width of the opening of the insulating layer which is provided in the first surface, it is possible to increase a margin for the variation in, for example, the size or position of the opening. In addition, since the distance between the first point and the fourth point is large, it is easy to design the insulating layer such that a portion of the insulating layer, which covers the edge of the second opening of the through hole, is thick and the average inclination angle of the surface of the portion of the insulating layer, which covers the edge of the second opening of the through hole, is small. The width of the opening of the insulating layer which is provided in the first surface means the distance between the opposite sides of the opening when the opening has a rectangular shape and means the diameter of the opening when the opening has a circular shape.

In the semiconductor device according to the above-mentioned aspect of the invention, the portion of the first wiring may be a pad portion that covers the first opening and a distance between the edge of the first opening and the edge of the opening of the insulating layer may be greater than a distance between the edge of the first opening and an edge of the pad portion. As described above, when the opening is formed in the insulating layer from the second opening of the semiconductor substrate, a variation in, for example, the size or position of the opening is likely to occur. However, since the distance between the edge of the first opening and the edge of the opening of the insulating layer is greater than the distance between the edge of the first opening and the edge of the pad portion, it is possible to increase a margin for the variation in, for example, the size or position of the opening. In addition, since the distance between the first point and the fourth point is large, it is easy to design the insulating layer such that a portion of the insulating layer, which covers the edge of the second opening of the through hole, is thick and the average inclination angle of the surface of the portion of the insulating layer, which covers the edge of the second opening of the through hole, is small.

In the semiconductor device according to the above-mentioned aspect of the invention, an aspect ratio that is a value obtained by dividing a depth of the through hole by a width of the second opening may be equal to or less than 1. According to this structure, it is possible to easily and reliably form the second wiring on the surface of the insulating layer. In addition, since the average inclination angle of the surface of the portion of the insulating layer, which covers the edge of the second opening, is small (that is, the surface is gentle), it is possible to reliably prevent the second wiring from being broken in the portion. Furthermore, it is possible to easily and reliably form the opening in the insulating layer. The depth of the through hole means the distance between the first opening and the second opening. The width of the second opening means the distance between the opposite sides of the second opening when the second opening has a rectangular shape and means the diameter of the second opening when the second opening has a circular shape.

In the semiconductor device according to the above-mentioned aspect of the invention, the insulating layer may be made of a resin. According to this structure, it is possible to easily and reliably form the insulating layer having the above-mentioned shape.

In the semiconductor device according to the above-mentioned aspect of the invention, the surface of the insulating layer provided on the inner surface of the through hole may be a continuous surface. According to this structure, since the concentration of stress on the entire region of the surface of the insulating layer is reduced, it is possible to reliably prevent the second wiring from being broken.

In the semiconductor device according to the above-mentioned aspect of the invention, the surface of the insulating layer provided on the inner surface of the through hole and the surface of the insulating layer provided on the second surface may be a continuous surface. According to this structure, since the thickness of the portion of the insulating layer, which covers the edge of the second opening, is ensured, it is possible to prevent the leakage of a current between the second wiring and the semiconductor substrate in the vicinity of the second opening. In addition, since the surface of the portion of the insulating layer, which covers the edge of the second opening, is smooth, it is possible to prevent the second wiring from being broken in the vicinity of the second opening.

The semiconductor device according to the above-mentioned aspect may further include a mounting substrate that has a third surface on which a plurality of third wirings are provided, and is provided so as to face the second surface. A plurality of avalanche photodiodes that operate in a Geiger mode may be provided in the semiconductor substrate. The through hole, the first wiring, and the second wiring may be provided so as to correspond to each of the plurality of avalanche photodiodes. Each of the plurality of avalanche photodiodes may be electrically connected to the corresponding second wiring through the corresponding first wiring. Each of the plurality of third wirings may be electrically connected to the corresponding second wiring through a bump electrode. In the semiconductor device, it is preferable to increase the percentage of the area of a plurality of pixels (corresponding to the avalanche photodiodes) in a light receiving surface. However, when the through hole is provided in each avalanche photodiode, it is desirable to reduce the percentage of the volume of the through holes in the semiconductor substrate. In addition, it is desirable to prevent, for example, the breaking of a wiring in the through hole and to reliably ensure an electrical connection through the through hole in the semiconductor substrate. In particular, in the semiconductor device, since an operating voltage applied to the avalanche photodiode is high, it is desirable to reliably insulate the wiring in the through hole from the semiconductor substrate. According to the semiconductor device, as described above, it is possible to reliably ensure an electrical connection through the through hole in the semiconductor substrate while reducing the percentage of the volume of the through holes in the semiconductor substrate. Therefore, it is possible to reduce the percentage of the volume of the through holes in the semiconductor substrate, to reliably ensure an electrical connection through the through hole in the semiconductor substrate, and to reliably insulate the wiring in the through hole from the semiconductor substrate.

Advantageous Effects of Invention

According to the invention, it is possible to provide a semiconductor device that can reliably ensure an electrical connection through a through hole in a semiconductor substrate while reducing the percentage of the volume of the through holes in the semiconductor substrate.

BRIEF DESCRIPTION OF DRAWINGS

FIG. 8 is a cross-sectional view illustrating a through hole and a peripheral portion thereof in the semiconductor device illustrated in. FIG. 1.

Figure 10:
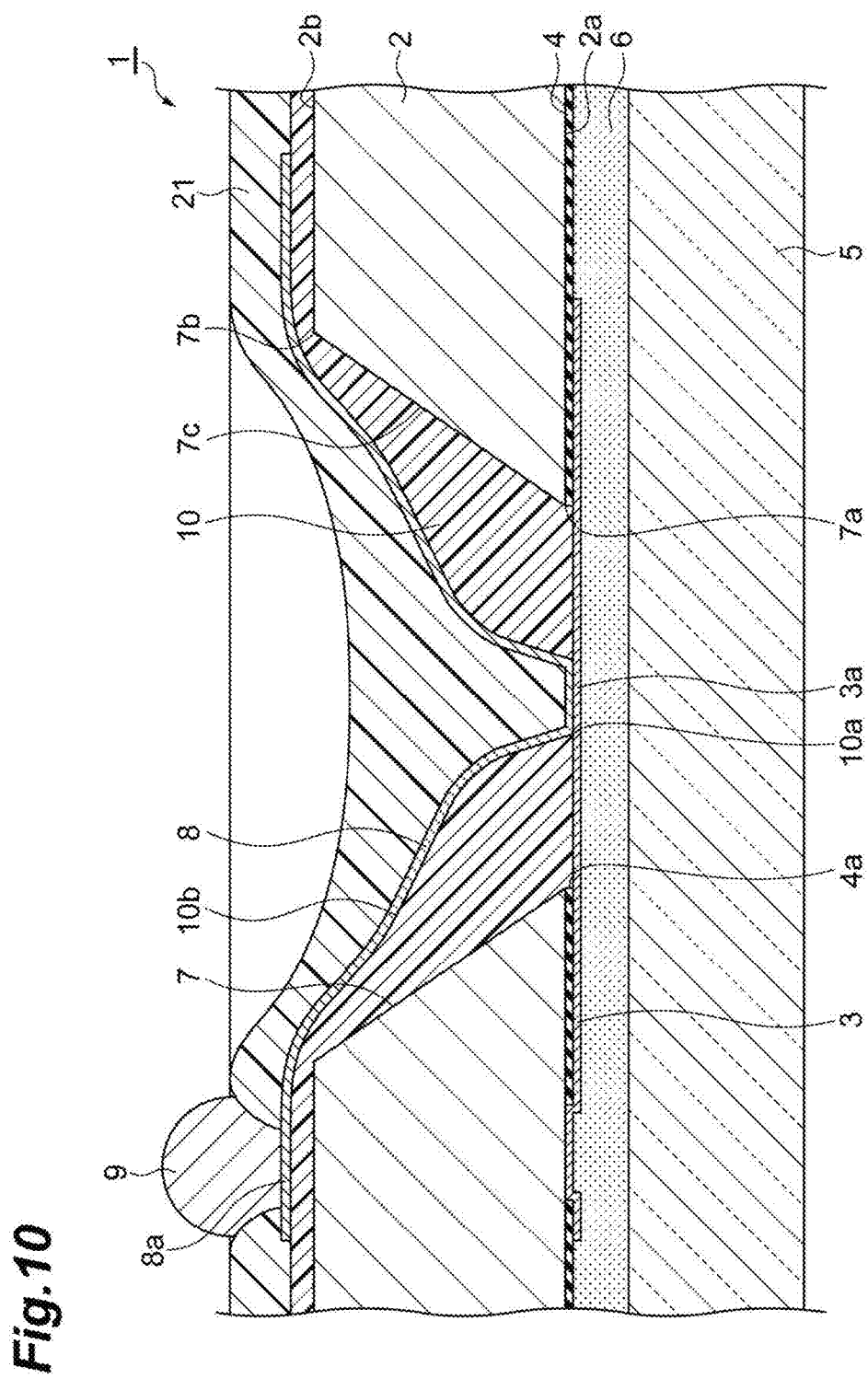
FIG. 10 is a partial cross-sectional view illustrating a semiconductor device according to a reference embodiment.
Figure 12:
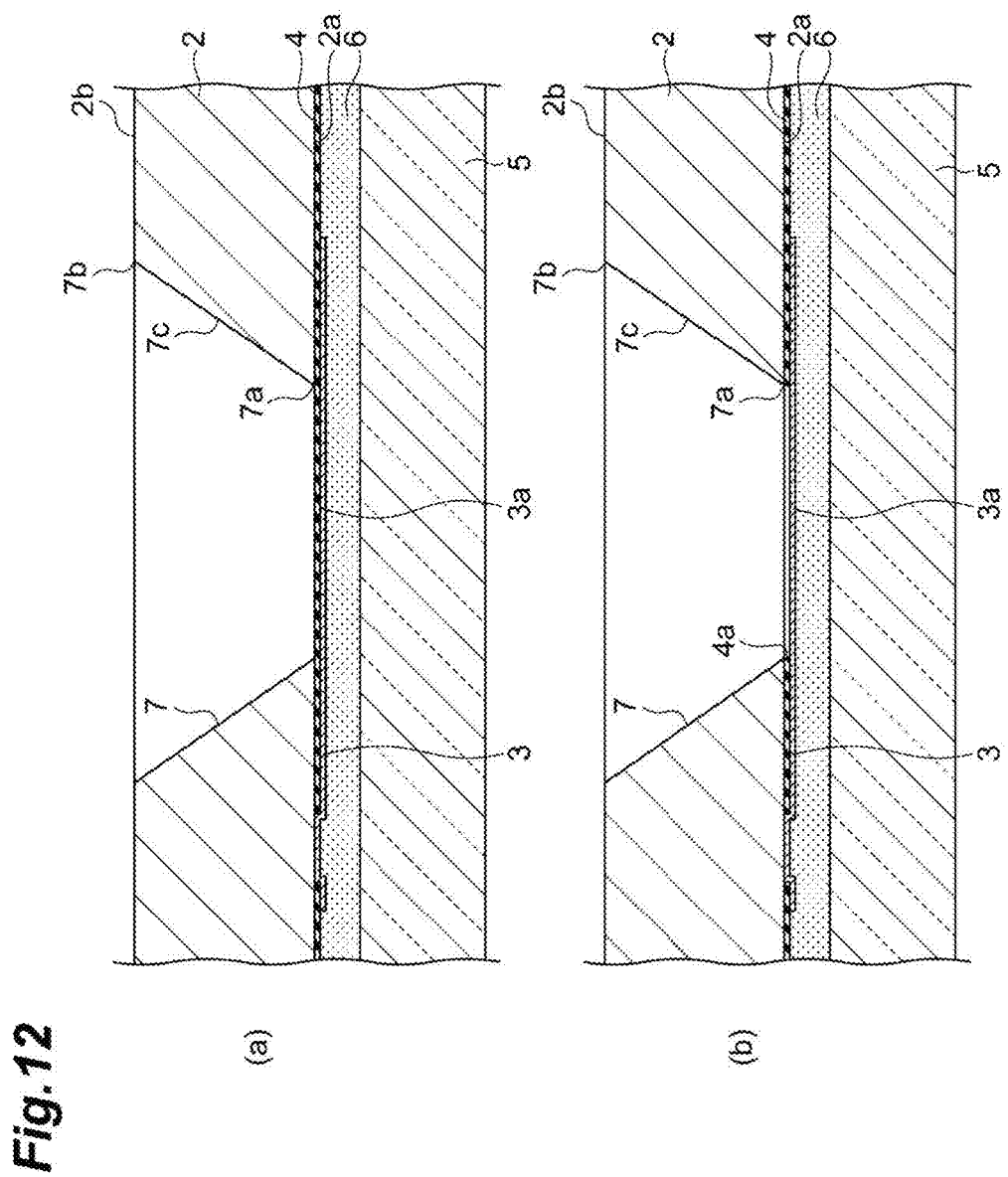

(a) and (b) of FIG. 12 are cross-sectional views illustrating a plurality of processes in a method for manufacturing the semiconductor device illustrated in FIG. 10.

Figure 13:
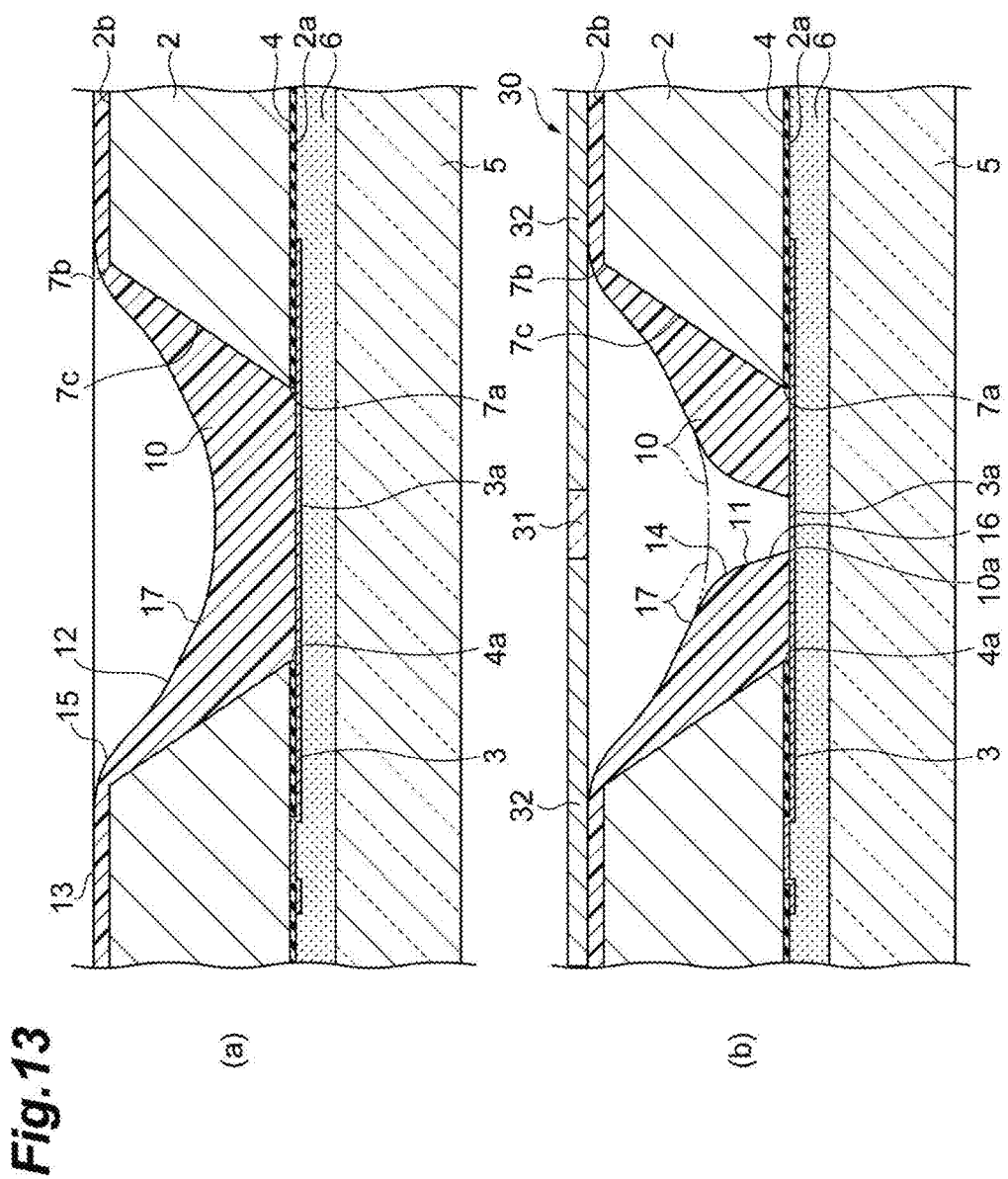

(a) and (b) of FIG. 13 are cross-sectional views illustrating a plurality of processes in the method for manufacturing the semiconductor device illustrated in FIG. 10.

Figure 14:
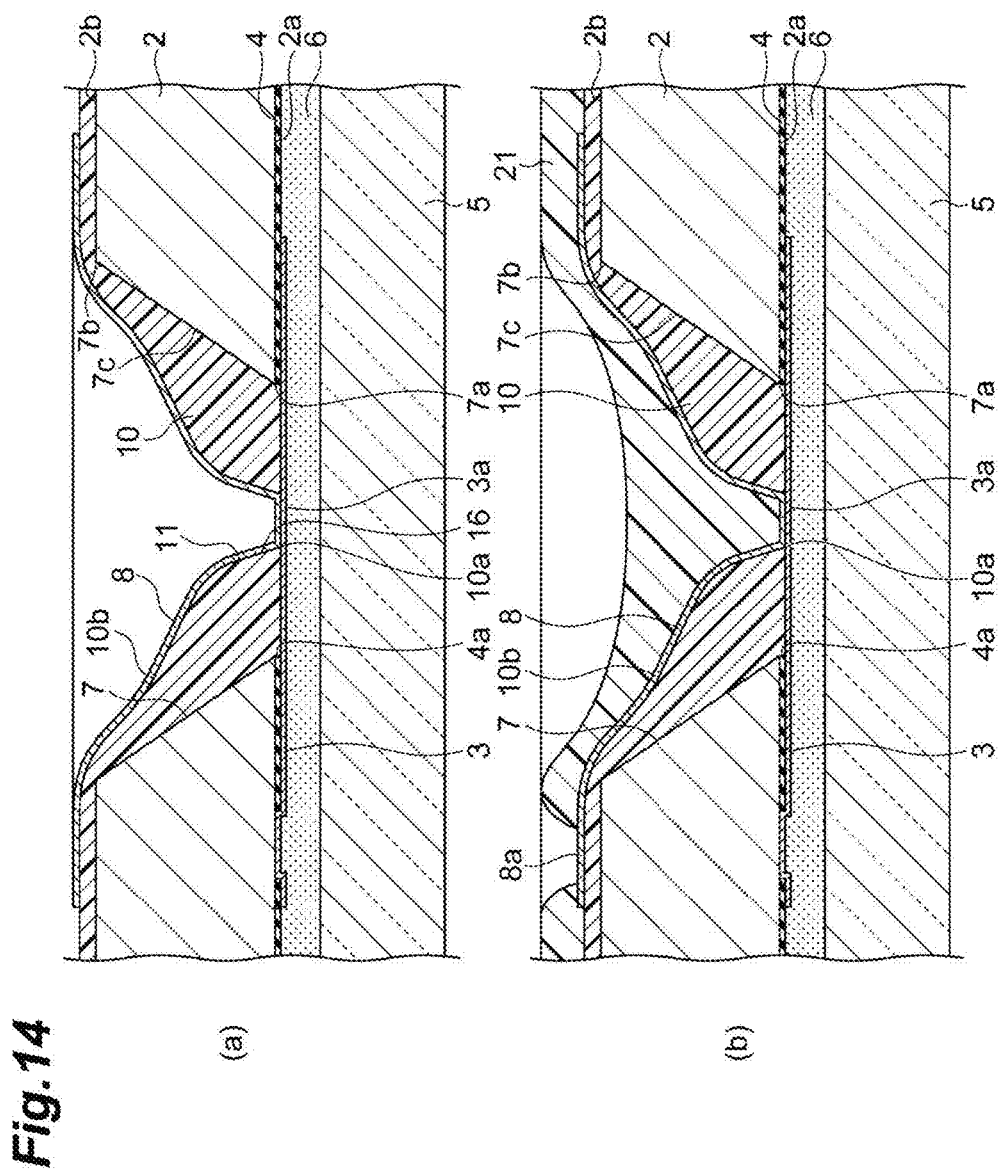

(a) and (b) of FIG. 14 are cross-sectional views illustrating a plurality of processes in the method for manufacturing the semiconductor device illustrated in FIG. 10.

Figure 15:
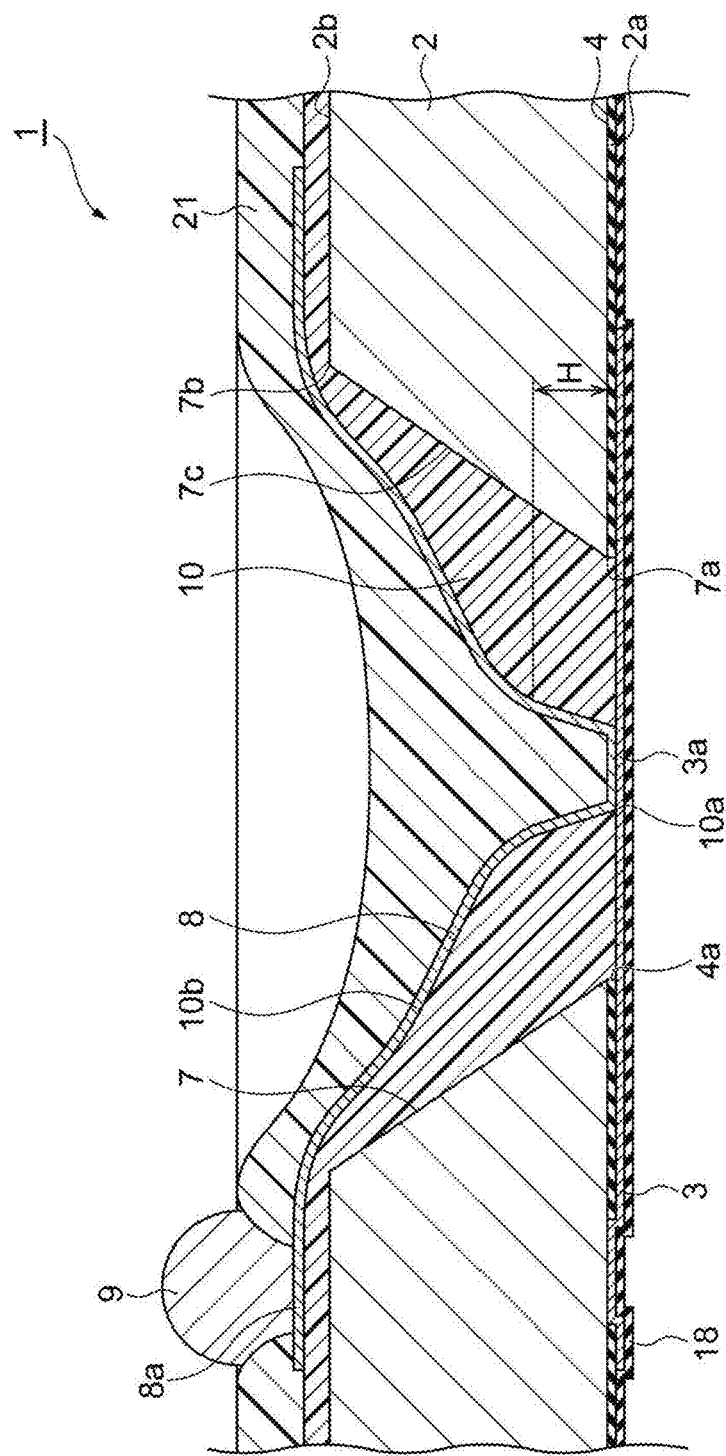

FIG. 15 is a partial cross-sectional view illustrating a modification example of the semiconductor device illustrated in FIG. 10.

Figure 16:
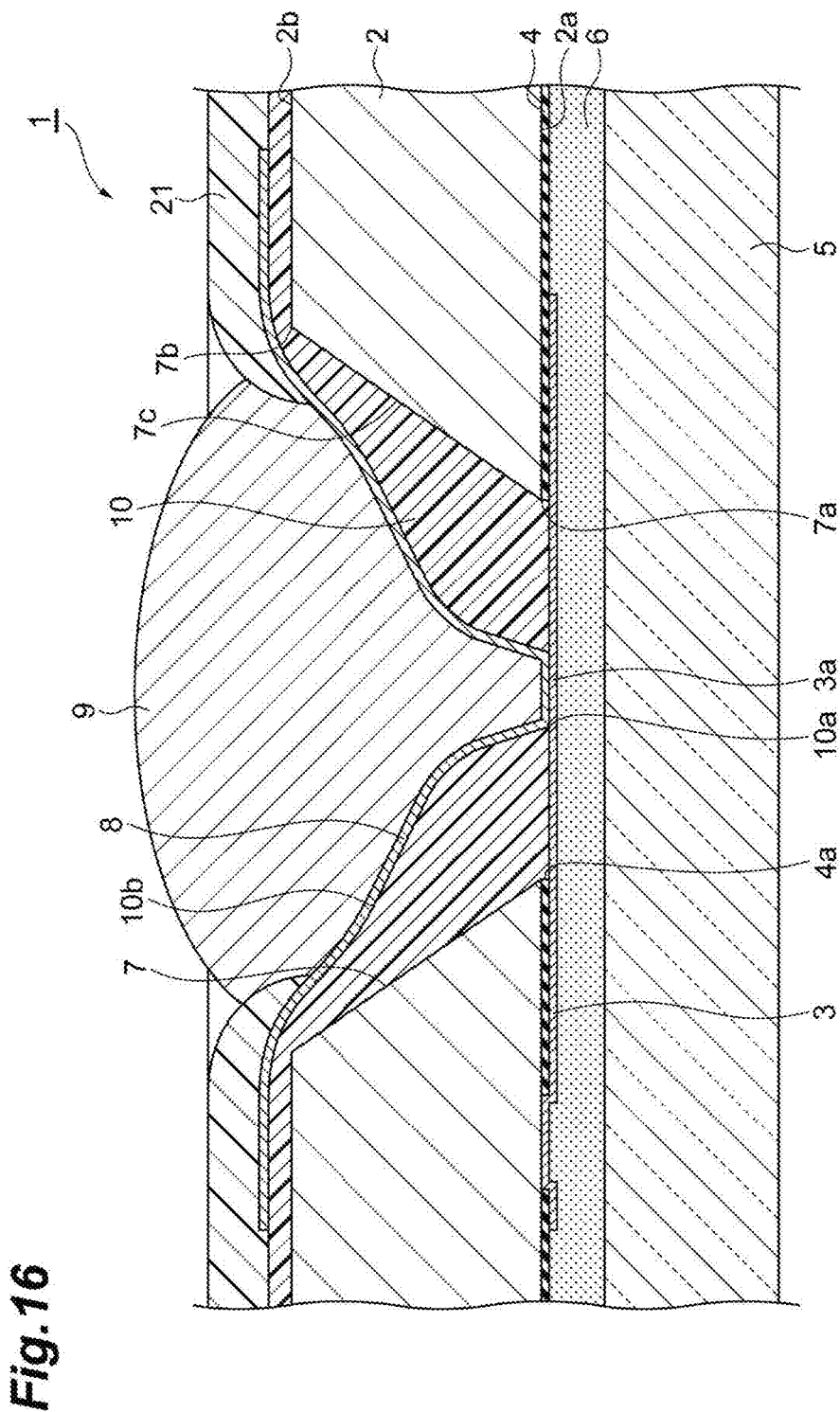

FIG. 16 is a partial cross-sectional view illustrating a modification example of the semiconductor device illustrated in FIG. 10.

Figure 17:
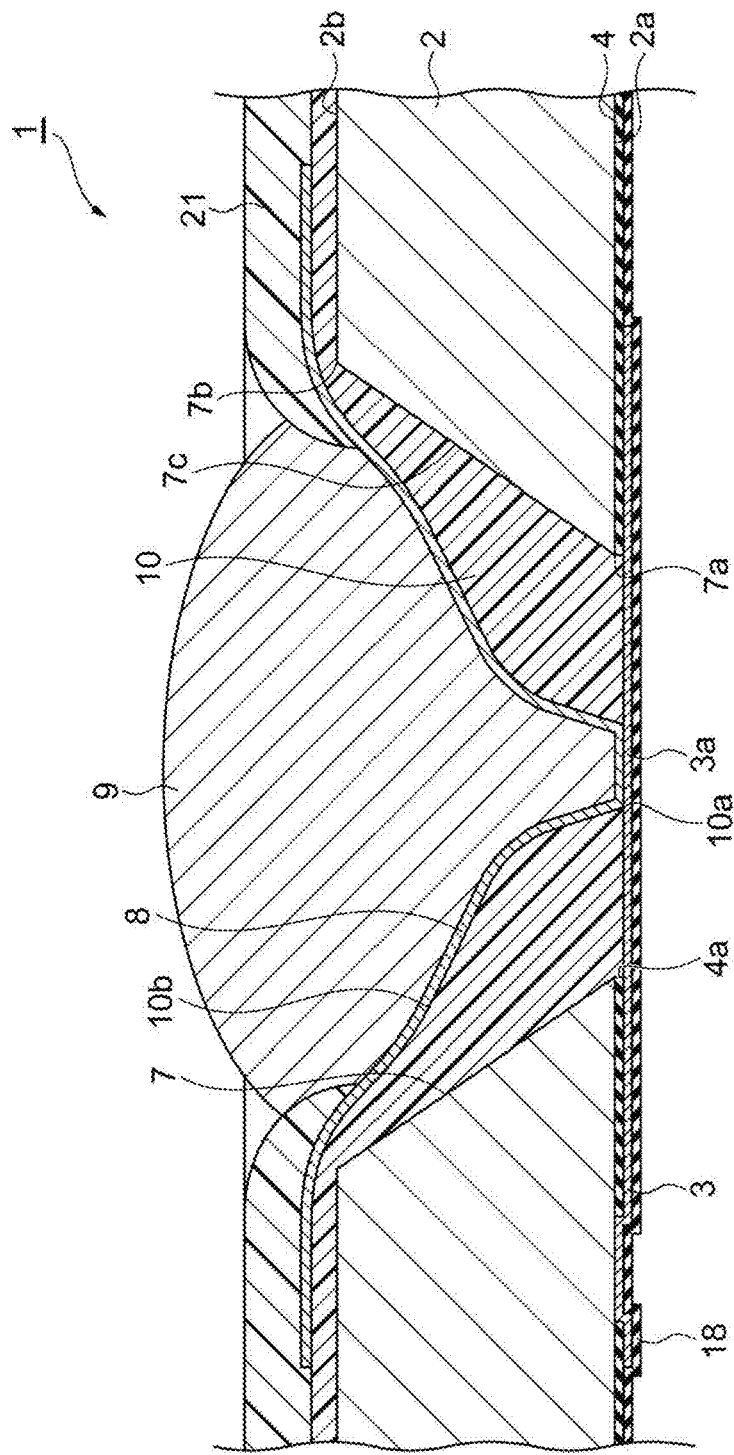

FIG. 17 is a partial cross-sectional view illustrating a modification example of the semiconductor device illustrated in FIG. 10.

DESCRIPTION OF EMBODIMENTS

Hereinafter, embodiments of the invention will be described in detail with reference to the drawings. In the drawings, the same or similar portions are denoted by the same reference numerals and the description thereof will not be repeated.

[Structure of Semiconductor Device]

Figure 1:
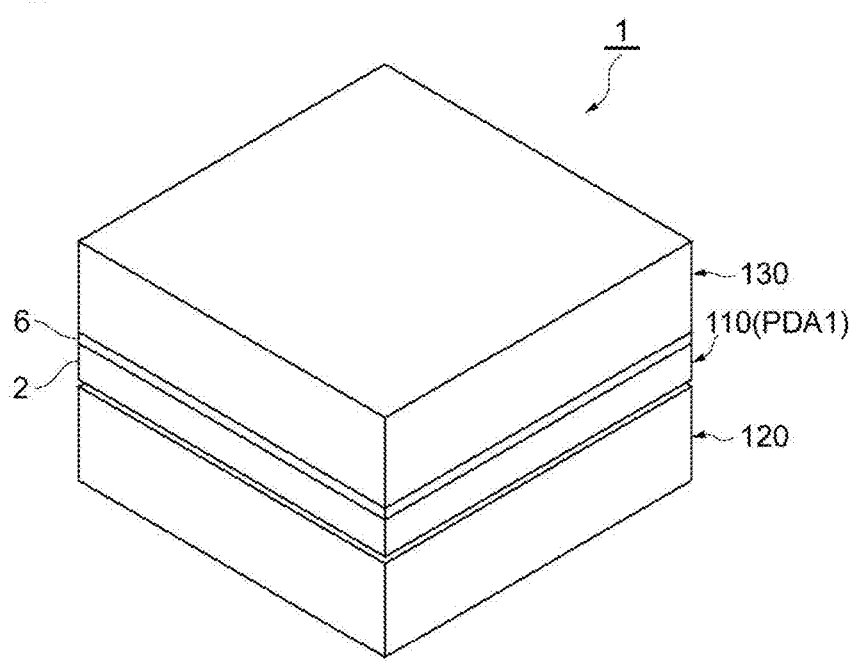
FIG. 1 is a perspective view illustrating a semiconductor device according to an embodiment of the invention.

As illustrated in FIG. 1, a semiconductor device 1 includes a semiconductor photodetection element 110, a mounting substrate 120, and a light transmissive substrate 130. The mounting substrate 120 is provided so as to face the semiconductor photodetection element 110. The light transmissive substrate 130 is provided so as to face the semiconductor photodetection element 110. The semiconductor photodetection element 110 is provided between the mounting substrate 120 and the light transmissive substrate 130.

Figure 2:
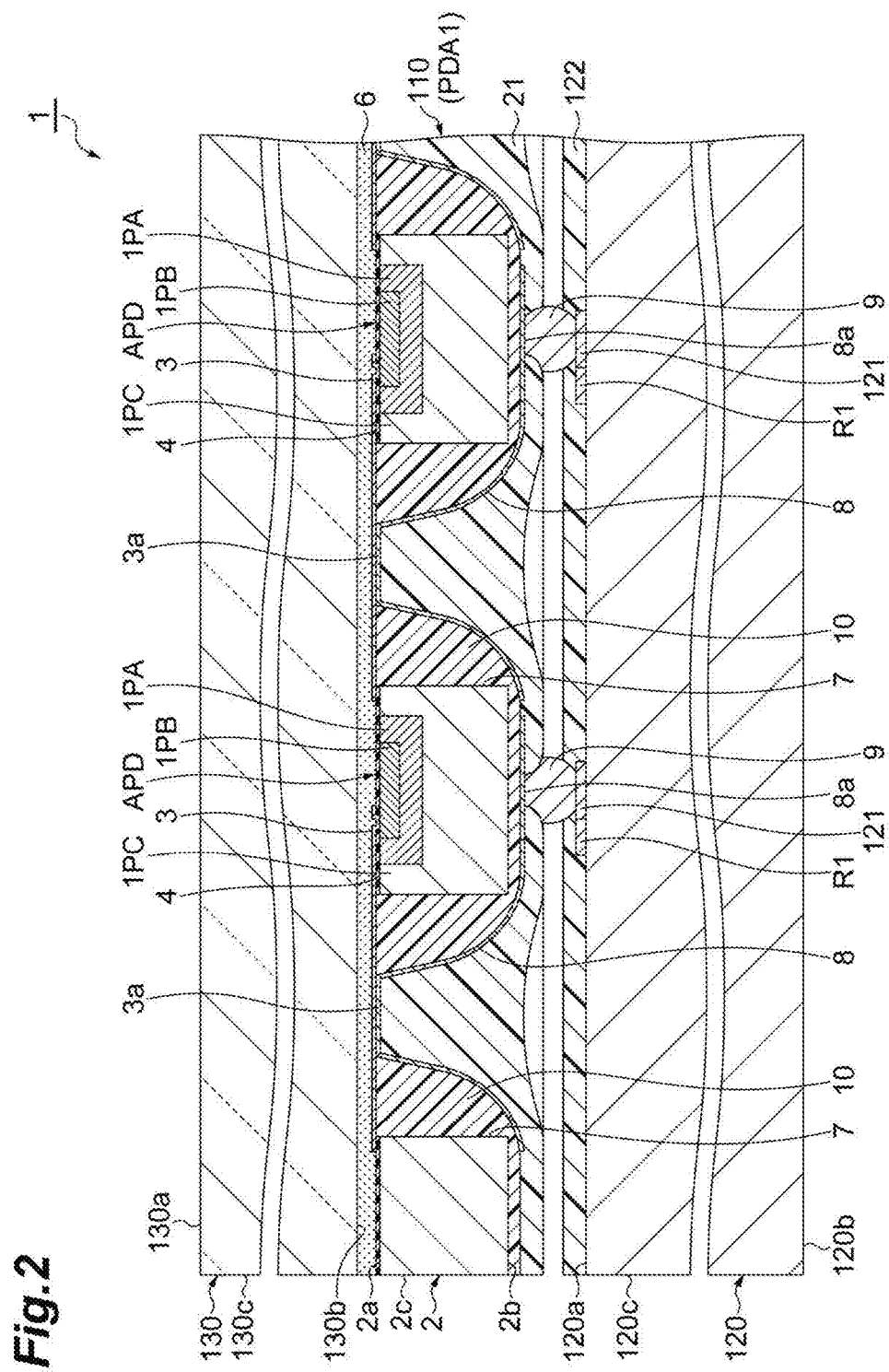
FIG. 2 is a cross-sectional view illustrating the semiconductor device illustrated in FIG. 1.

The semiconductor photodetection element 110 is a surface-illuminated photodiode array PDA1. The photodiode array PDA1 includes a semiconductor substrate 2 having a rectangular shape in a plan view (as viewed from a direction in which the light transmissive substrate 130 and the semiconductor photodetection element 110 face each other). As illustrated in FIG. 2, the semiconductor substrate 2 has a main surface (first surface) 2a and a main surface (second surface) 2b that are opposite to each other. The semiconductor substrate 2 is an N-type (first-conductivity-type) semiconductor substrate made of Si.

The photodiode array PDA1 includes a plurality of avalanche photodiodes APD that are formed in the semiconductor substrate 2. One avalanche photodiode APD forms one pixel in the photodiode array PDA1. Each avalanche photodiode APD is connected in series to each quenching resistor R1 and the avalanche photodiodes APD are connected in parallel to each other. A reverse bias voltage is applied from a power supply to each avalanche photodiode APD. An output current from the avalanche photodiode APD is detected by a signal processing unit SP that will be described below.

Each avalanche photodiode APD includes a P-type (second-conductivity-type) first semiconductor region 1PA and a P-type (second-conductivity-type) second semiconductor region 1PB. The first semiconductor region 1PA is formed in a region on the main surface 2a side of the semiconductor substrate 2. The second semiconductor region 1PB is formed in the first semiconductor region 1PA and has a higher impurity concentration than the first semiconductor region 1PA. The second semiconductor region 1PB has a polygonal shape (an octagonal shape in this embodiment) in a plan view. The depth of the first semiconductor region 1PA is greater than the depth of the second semiconductor region 1PB.

The semiconductor substrate 2 includes an N-type (first-conductivity-type) semiconductor region 1PC. The semiconductor region 1PC is formed at a position corresponding to a through hole 7, which will be described below, in a region on the main surface 2a side of the semiconductor substrate 2. The semiconductor region 1PC prevents a PN junction that is formed between the N-type semiconductor substrate 2 and the P-type first semiconductor region 1PA from being exposed through the through hole 7.

Figure 3:
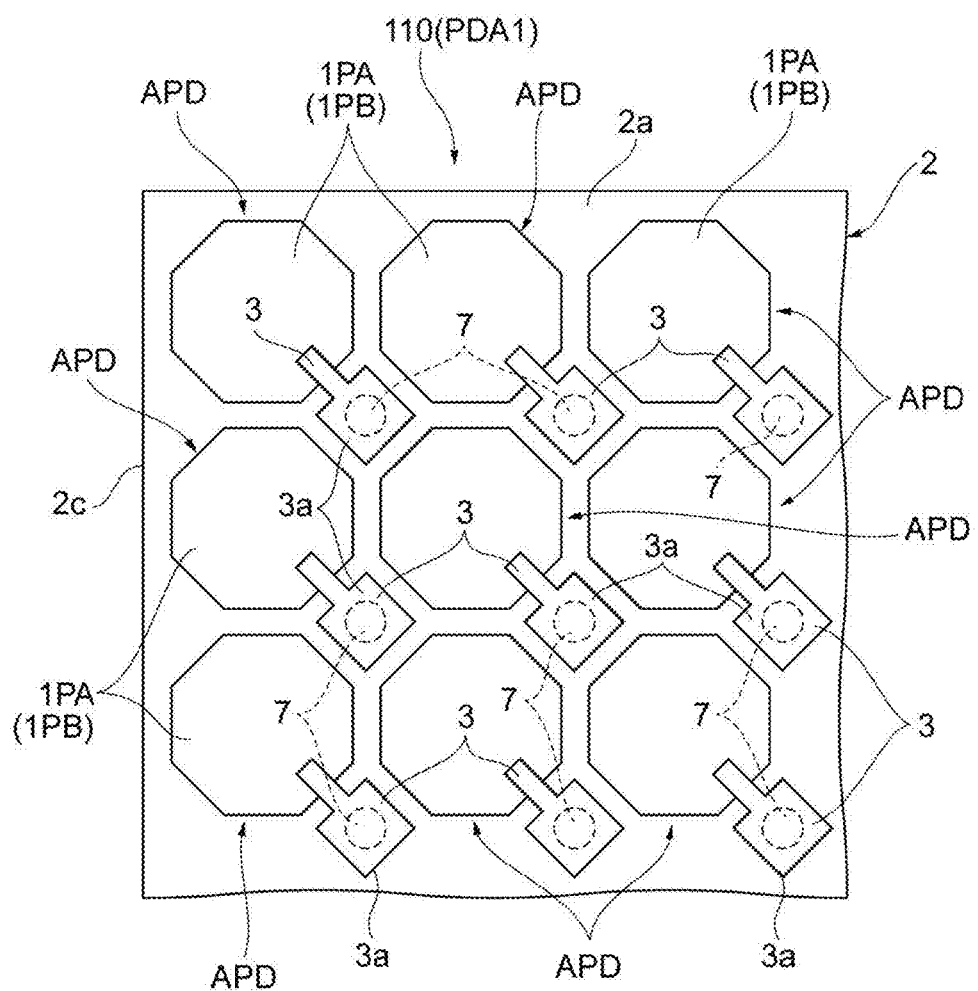
FIG. 3 is a plan view illustrating a semiconductor photodetection element of the semiconductor device illustrated in FIG. 1.
Figure 7:
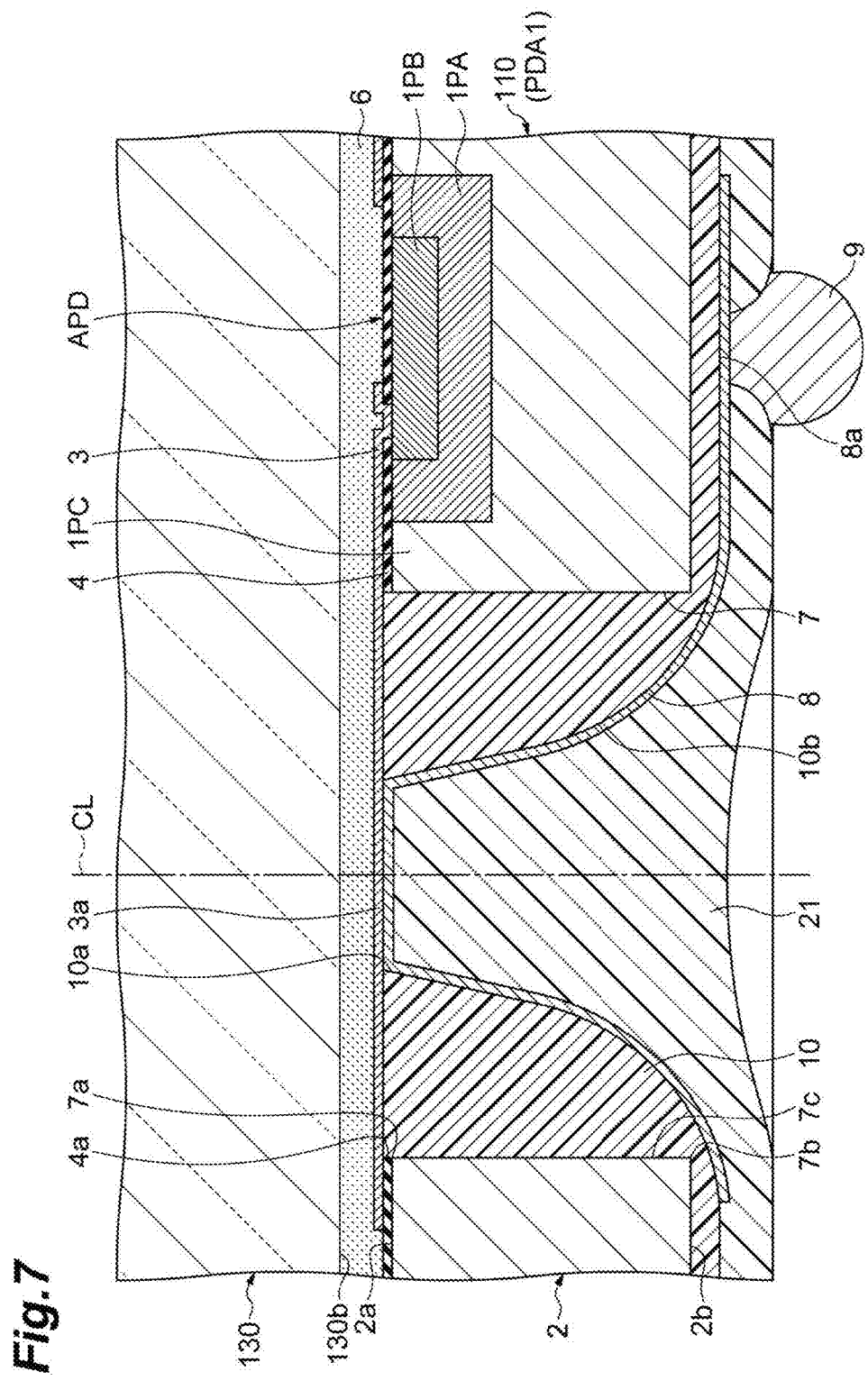
FIG. 7 is a partial cross-sectional view illustrating the semiconductor device illustrated in FIG. 1.

As illustrated in FIG. 2, FIG. 3, and FIG. 7, each avalanche photodiode APD includes a first wiring 3. The first wiring 3 is formed on the main surface 2a of the semiconductor substrate 2, with an oxide film 4 interposed therebetween. The first wiring 3 is connected to the second semiconductor region 1PB through an opening that is formed in the oxide film 4. The first wiring 3 includes a pad portion 3a that is provided above the through hole 7 in a plan view. The first semiconductor region 1PA is electrically connected to the first wiring 3 through the second semiconductor region 1PB. In FIG. 3, the oxide film 4 illustrated in FIG. 2 is not illustrated.

Figure 4:
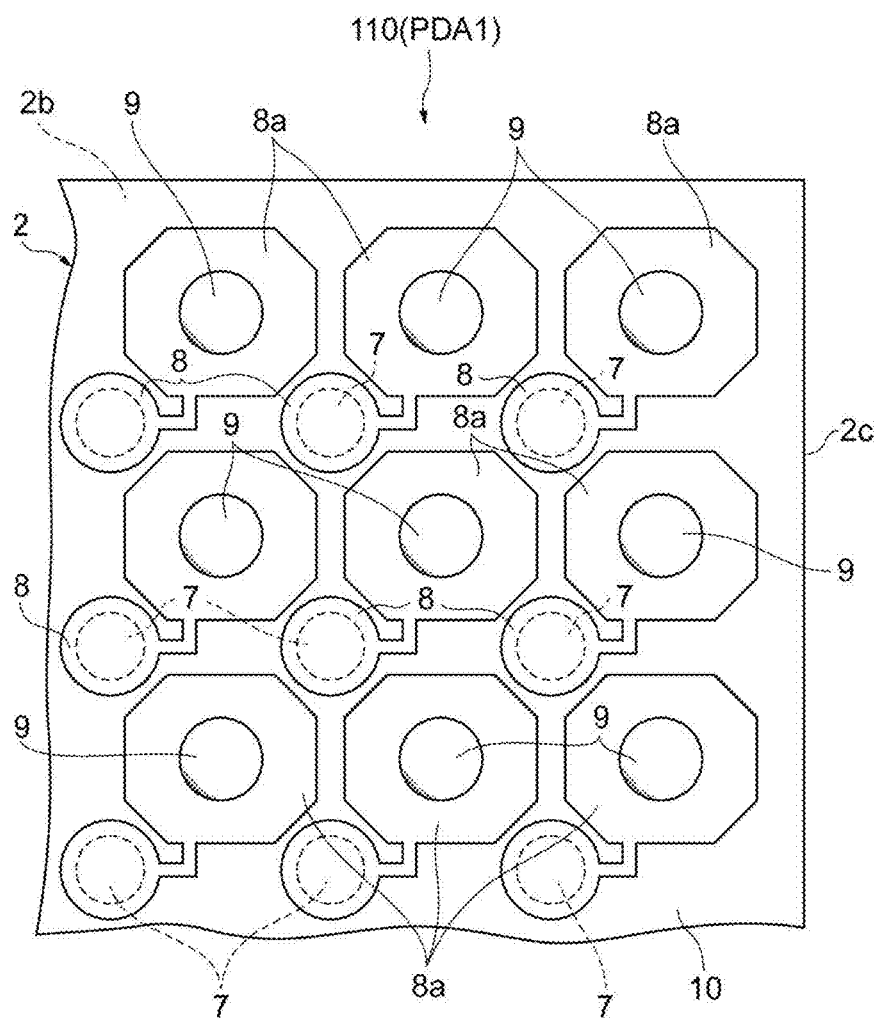
FIG. 4 is a bottom view illustrating the semiconductor photodetection element of the semiconductor device illustrated in FIG. 1.

As illustrated in FIG. 2, FIG. 4, and FIG. 7, each avalanche photodiode APD includes a second wiring 8. The second wiring 8 is formed on the inner surface of the through hole 7 and the main surface 2b of the semiconductor substrate 2, with an insulating layer 10 interposed therebetween. The second wiring 8 includes a pad portion 8a that is provided on the main surface 2b of the semiconductor substrate 2 so as to overlap the second semiconductor region 1PB in a plan view. An electrode (not illustrated) is formed on the main surface 2b of the semiconductor substrate 2 so as to be electrically connected to the semiconductor substrate 2. In FIG. 4, a resin protective layer 21 illustrated in FIG. 2 is not illustrated.

As illustrated in FIG. 2 and FIG. 7, the through hole 7 is provided in each avalanche photodiode APD. In each avalanche photodiode APD, the first wiring 3 and the second wiring 8 are electrically connected to each other through the through hole 7.

As illustrated in FIG. 3, the through hole 7 is provided in a region between the avalanche photodiodes APD in a plan view. In this embodiment, M (M is a natural number) rows of the avalanche photodiodes APD and N (N is a natural number) columns of the avalanche photodiodes APD are two-dimensionally arranged in a first direction and a second direction perpendicular to the first direction, respectively. The through hole 7 is provided in a region that is surrounded by four first semiconductor regions 1PA. Since the through hole 7 is provided in each avalanche photodiode APD, M rows of the through holes 7 and N columns of the through holes 7 are two-dimensionally arranged in the first direction and the second direction, respectively.

The first wiring 3 and the second wiring 8 are made of metal such as Al. When the semiconductor substrate 2 is made of Si, Au, Cu, Ti, Ni, Pt, and stacked materials thereof may be used as the electrode material in addition to Al. A sputtering method can be used as a method for forming the first wiring 3 and the second wiring 8.

When the semiconductor substrate 2 is made of Si, a group-III element, such as B, is used as P-type impurities and a group-V element, such as N, P, or As, is used as N-type impurities. Even when an N type and a P type that are the conductivity types of a semiconductor are substituted with each other to form an element, the element can have the same function. For example, a diffusion method and an ion implantation method can be used as a method for adding the impurities.

For example, $SiO_2$ can be used as the material forming the oxide film 4. For example, a CVD (Chemical Vapor Deposition) method, a thermal oxidation method, and a sputtering method are used as a method for forming the oxide film 4 made of $SiO_2$. In addition, an insulating layer made of other insulating materials, such as SiN, may be provided instead of the oxide film 4.

As illustrated in FIG. 2, the mounting substrate 120 has a main surface (third surface) 120a and a main surface 120b that are opposite to each other. The mounting substrate 120 has a rectangular shape in a plan view. The main surface 120a faces the main surface 2b of the semiconductor substrate 2. The mounting substrate 120 includes a plurality of third wirings 121 that are formed on the main surface 120a. The third wiring 121 is provided on the main surface 120a so as to face the pad portion 8a of the second wiring 8.

A side surface 2c of the semiconductor substrate 2 is flush with a side surface 120c of the mounting substrate 120. That is, the outer edge of the semiconductor substrate 2 is aligned with the outer edge of the mounting substrate 120 in a plan view.

The second wiring 8 and the third wiring 121 are electrically connected to each other through a lead electrode 9 that is a bump electrode. In this way, the second semiconductor region 1PB is electrically connected to the third wiring 121 through the first wiring 3, the second wiring 8, and the lead electrode 9.

The third wiring 121 is made of metal, such as Al, similarly to the first wiring 3 and the second wiring 8. In addition to Al, Au, Cu, Ti, Ni, Pt, and stacked materials thereof may be used as the electrode material. The lead electrode 9 is made of, for example, solder.

The lead electrode 9 is formed on the pad portion 8a of the second wiring 8, with UBM (Under Bump Metal) interposed therebetween. The UBM is a material that has a high electrical and physical connectivity to the lead electrode 9. For example, an electroless plating method can be used as a method for forming the UBM. For example, a method for providing a solder ball and a printing method can be used as a method for forming the lead electrode 9.

Figure 5:
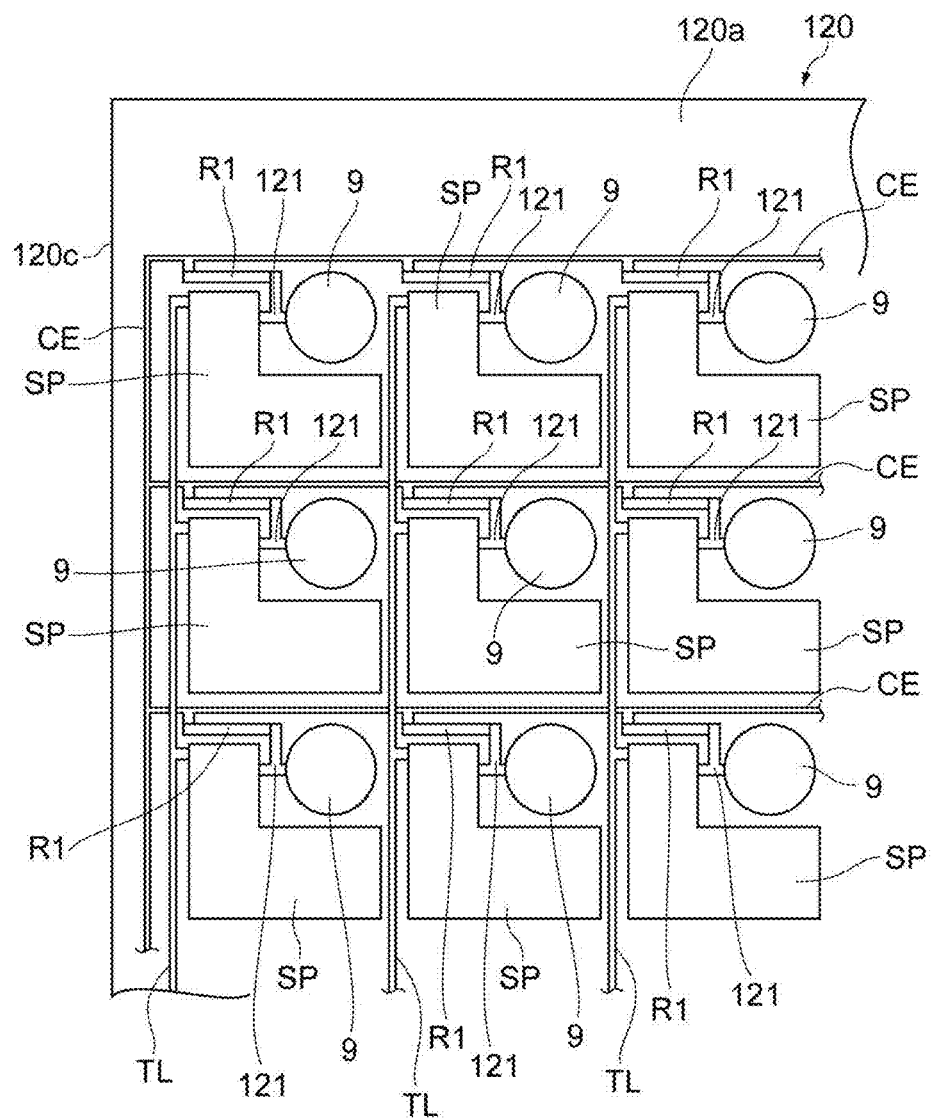
FIG. 5 is a plan view illustrating a mounting substrate of the semiconductor device illustrated in FIG. 1.

As illustrated in FIG. 5, the mounting substrate 120 includes a plurality of quenching resistors R1 and a plurality of signal processing units SP. The mounting substrate 120 forms an ASIC (Application Specific Integrated Circuit). In FIG. 5, a passivation film 122 illustrated in FIG. 2 is not illustrated.

Each quenching resistor R1 is provided on the main surface 120a. One end of each quenching resistor R1 is connected to the corresponding third wiring 121 and the other end of each quenching resistor R1 is connected to a common electrode CE. Each quenching resistor R1 forms a passive quenching circuit. A plurality of quenching resistors R1 are connected in parallel to the common electrode CE.

Each signal processing unit SP is provided on the main surface 120a. An input end of each signal processing unit SP is connected to the corresponding third wiring 121 and an output end of each signal processing unit SP is connected to a corresponding signal line TL. An output signal from each avalanche photodiode APD is input to each signal processing unit SP through the first wiring 3, the second wiring 8, the lead electrode 9, and the third wiring 121. Each signal processing unit SP processes the output signal from each avalanche photodiode APD. The signal processing unit SP includes a CMOS circuit that converts the output signal from each avalanche photodiode APD into a digital pulse.

The passivation film 122 in which openings are formed at the positions corresponding to the lead electrodes 9 is formed on the main surface 120a of the mounting substrate 120. The passivation film 122 is made of, for example, SiN. For example, a CVD (Chemical Vapor Deposition) method can be used as a method for forming the passivation film 122.

As illustrated in FIG. 2, the light transmissive substrate 130 has a main surface 130a and a main surface 130b that are opposite to each other. The light transmissive substrate 130 has a rectangular shape in a plan view. The light transmissive substrate 130 is made of a light transmissive material such as glass. The main surface 130b faces the main surface 2a of the semiconductor substrate 2. The light transmissive substrate 130 and the semiconductor photodetection element 110 are optically and physically connected to each other by an adhesive layer 6 made of an optical adhesive. Furthermore, in some cases, a scintillator is optically and physically connected to the main surface 130a of the light transmissive substrate 130 by an optical adhesive. In this case, scintillation light emitted from the scintillator passes through the light transmissive substrate 130 and is incident on the semiconductor photodetection element 110.

The side surface 2c of the semiconductor substrate 2 is flush with a side surface 130c of the light transmissive substrate 130. That is, the outer edge of the semiconductor substrate 2 is aligned with the outer edge of the light transmissive substrate 130 in a plan view.

Figure 6:
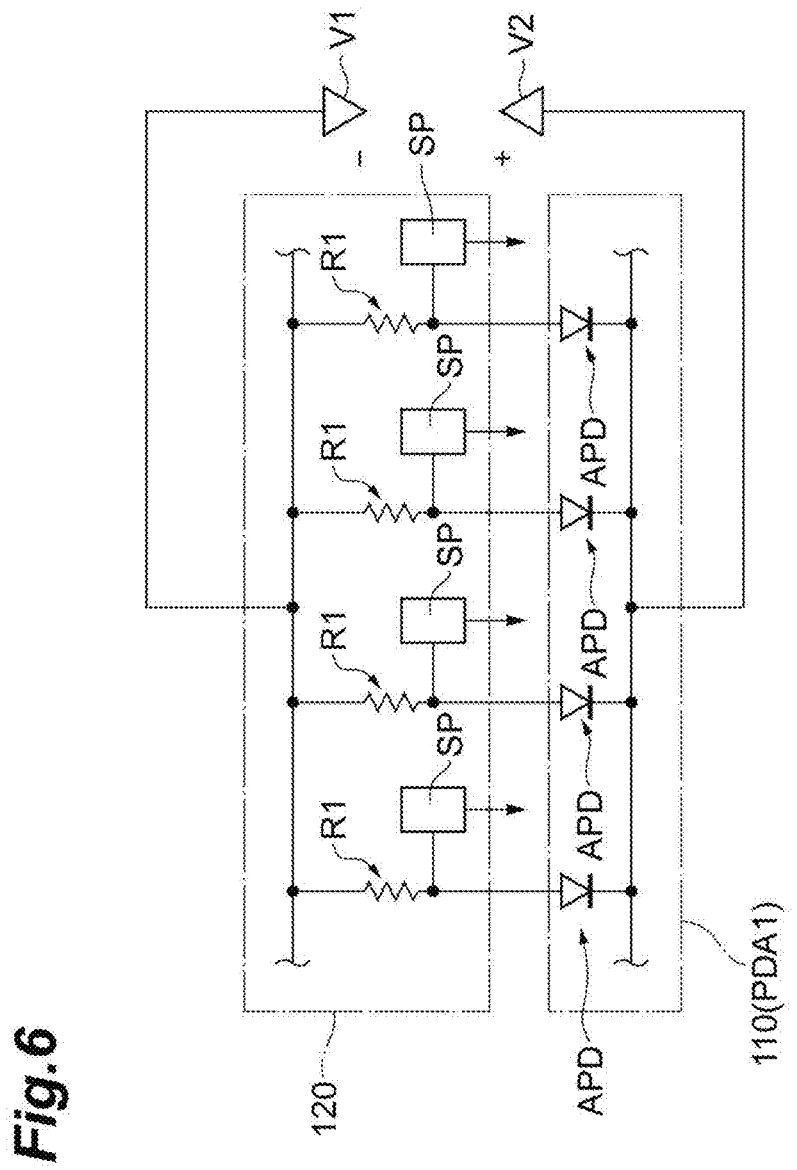
FIG. 6 is a circuit diagram illustrating the semiconductor device illustrated in FIG. 1.

In the semiconductor device 1 (semiconductor photodetection element 110) having the above-mentioned structure, a PN junction is formed between the N-type semiconductor substrate 2 and the P-type first semiconductor region 1PA to form the avalanche photodiode APD. The semiconductor substrate 2 is electrically connected to the electrode (not illustrated) formed on the main surface 2b and the first semiconductor region 1PA is electrically connected to the first wiring 3 through the second semiconductor region 1PB. As illustrated in FIG. 6, the quenching resistor R1 is connected in series to the avalanche photodiode APD.

In the photodiode array PDA1, each avalanche photodiode APD is operated in a Geiger mode. In the Geiger mode, a reverse voltage (reverse bias voltage) that is higher than the breakdown voltage of the avalanche photodiode APD is applied between an anode and a cathode of the avalanche photodiode APD. That is, a negative (−) potential V1 is applied to the anode and a positive (+) potential V2 is applied to the cathode. The polarities of the potentials are relative and one of the potentials may be a ground potential.

The anode is the P-type first semiconductor region 1PA and the cathode is the N-type semiconductor substrate 2. When light (photon) is incident on the avalanche photodiode APD, photoelectric conversion is performed in the substrate and a photoelectron is generated. In a region in the vicinity of a PN junction interface in the first semiconductor region 1PA, avalanche multiplication is performed and an amplified electron group flows to the electrode formed on the rear surface of the semiconductor substrate 2. That is, when light (photon) is incident on any one of the pixels (avalanche photodiodes APD) of the semiconductor photodetection element 110 (photodiode array PDA1), the light is amplified, is extracted as a signal from the third wiring 121, and is input to the corresponding signal processing unit SP.

[Structure of Through Hole and Peripheral Portion]

As illustrated in FIG. 7, the through hole 7 to extend from the main surface 2a to the main surface 2b is formed in the semiconductor substrate 2. A first opening 7a of the through hole 7 is located at the main surface 2a of the semiconductor substrate 2 and a second opening 7b of the through hole 7 is located at the main surface 2b of the semiconductor substrate 2. The first opening 7a is connected to an opening 4a that is formed in the oxide film 4 and is covered by the pad portion 3a of the first wiring 3. That is, the pad portion 3a that is a portion of the first wiring 3 is located above the first opening 7a of the through hole 7.

The through hole 7 is a vertical hole. That is, an angle formed between an inner surface 7c of the through hole 7 (when the inner surface 7c of the through hole 7 is a curved surface, such as a cylindrical surface, a plane tangent to the curved surface) and the main surface 2a (that is, for a plane including a center line CL of the through hole 7, when attention is paid to each of regions on both sides of the center line CL, the average value of an angle formed between an intersection line between the plane and the inner surface 7c of the through hole 7 and the main surface 2a) is in the range of 80° to 100° (preferably, in the range of 85° to 95°). In this embodiment, the through hole 7 is formed in a cylindrical shape having the center line CL perpendicular to the main surfaces 2a and 2b. In this case, the inner surface 7c of the through hole 7 is perpendicular to the main surfaces 2a and 2b and the angle formed between the inner surface 7c of the through hole 7 and the main surface 2a is 90°.

The aspect ratio of the through hole 7 is equal to or less than 1. The aspect ratio is a value obtained by dividing the depth of the through hole 7 (the distance between the first opening 7a and the second opening 7b) by the width of the second opening 7b (the distance between opposite sides of the second opening 7b when the second opening 7b has a rectangular shape, and the diameter of the second opening 7b when the second opening 7b has a circular shape). For example, the depth of the through hole 7 is 20 μm and the width of the second opening 7b is 30 μm. In this case, the aspect ratio is 0.667. The through hole 7 having a cylindrical shape or a square pillar shape is formed by, for example, dry etching.

The insulating layer 10 made of a resin is provided on the inner surface 7c of the through hole 7 and the main surface 2b of the semiconductor substrate 2. The insulating layer 10 is continuous through the second opening 7b of the through hole 7. The insulating layer 10 extends to the pad portion 3a of the first wiring 3 through the opening 4a of the oxide film 4 in the through hole 7 and has an opening 10a formed in the main surface 2a of the semiconductor substrate 2. The second wiring 8 is provided on a surface 10b of the insulating layer 10 (a surface opposite to the inner surface 7c of the through hole 7 and the main surface 2b of the semiconductor substrate 2). The second wiring 8 is electrically connected to the pad portion 3a of the first wiring 3 in the opening 10a of the insulating layer 10. The second wiring 8 is covered by the resin protective layer 21 except the pad portion 8a on which the lead electrode 9 that is a bump electrode is provided.

Figure 8:
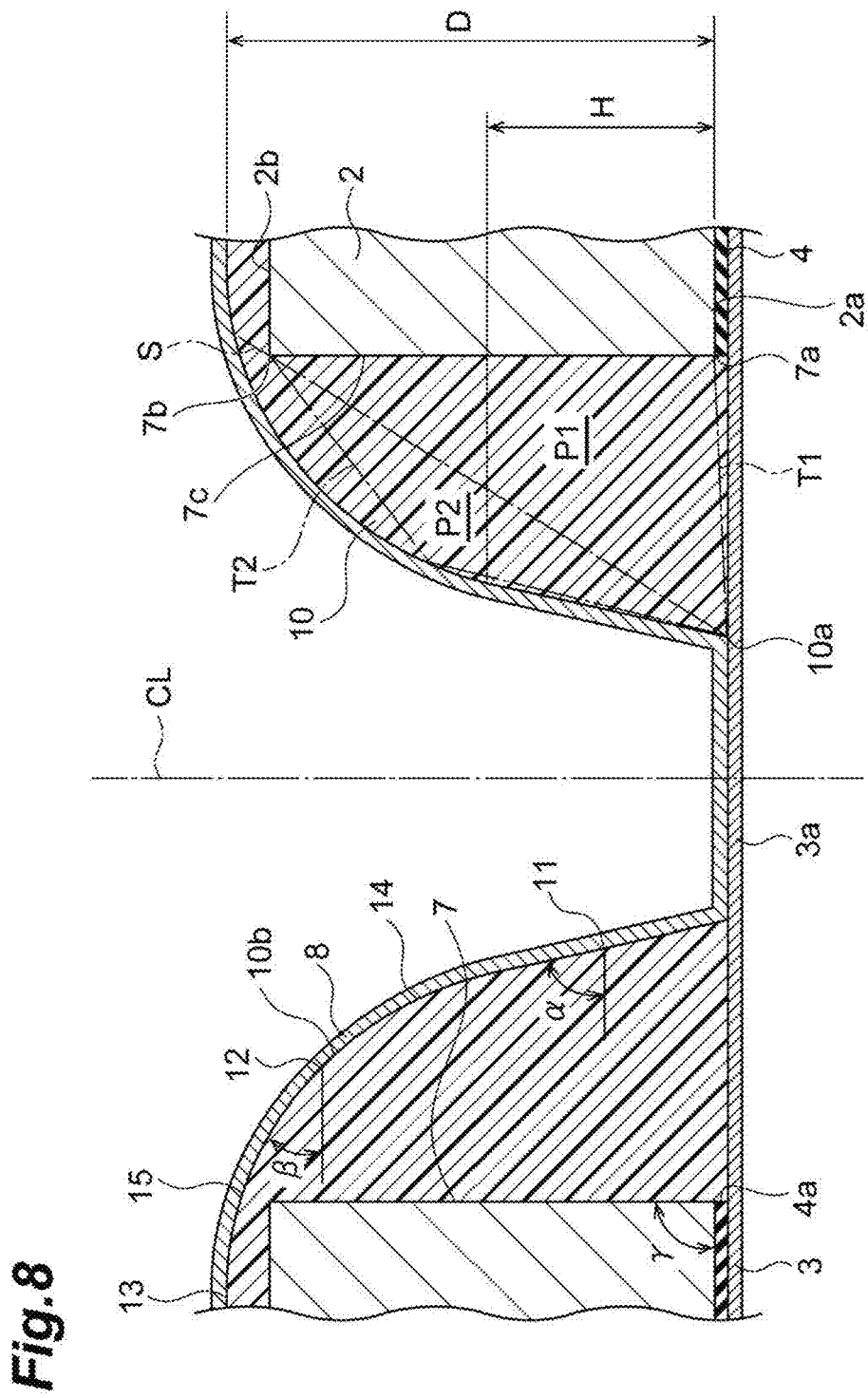
Figure 9:
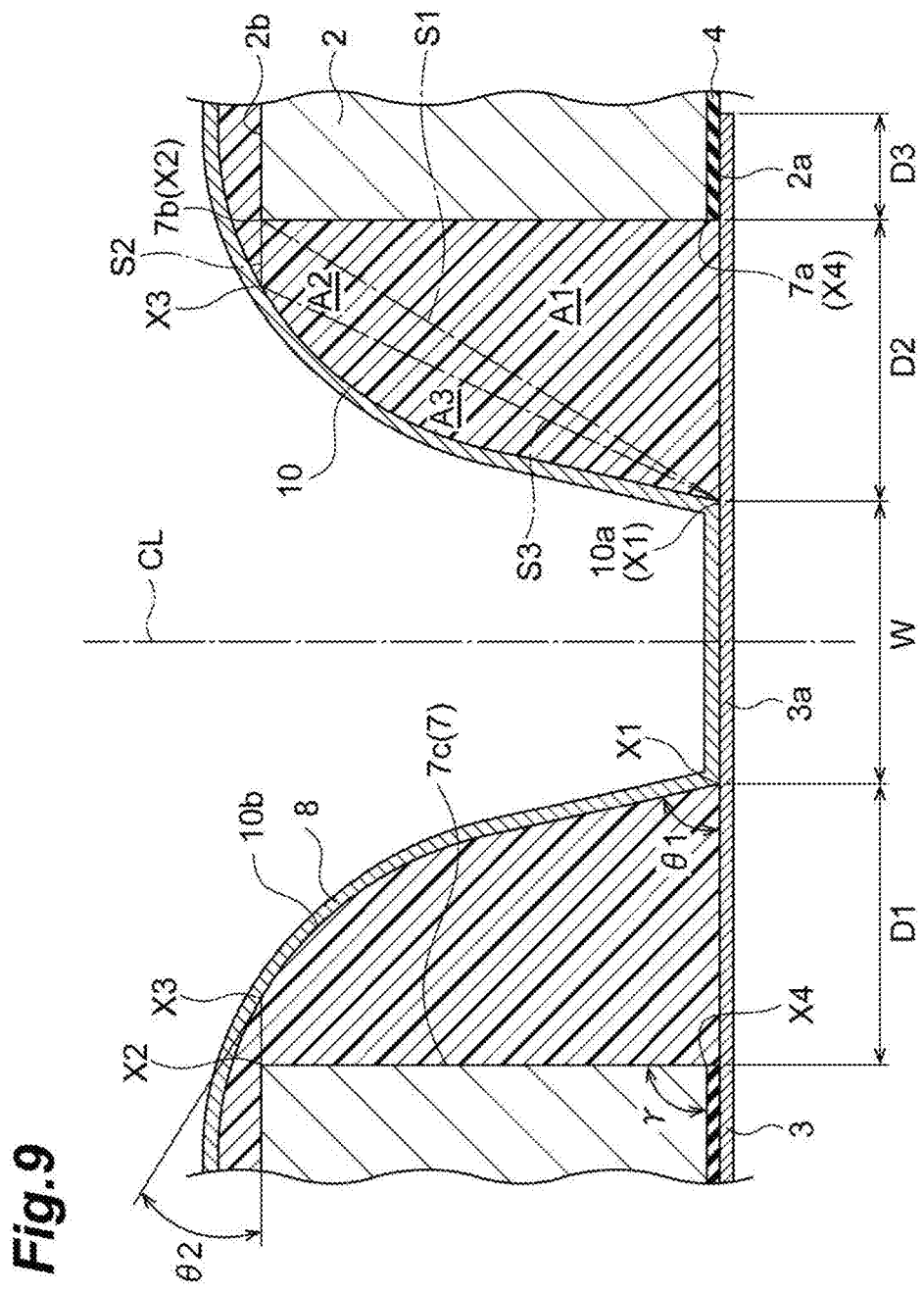
FIG. 9 is a cross-sectional view illustrating the through hole and the peripheral portion thereof in the semiconductor device illustrated in FIG. 1.

The insulating layer 10 will be described in detail with reference to FIG. 8 and FIG. 9. In FIG. 8 and FIG. 9, for example, the light transmissive substrate 5, the adhesive layer 6, the lead electrode 9, and the resin protective layer 21 are not illustrated. In addition, in FIG. 8 and FIG. 9, each component is illustrated such that the upper and lower sides are opposite to those in FIG. 7.

As illustrated in FIG. 8, the surface 10b of the insulating layer 10 includes a first region 11 that extends to the first opening 7a in the through hole 7, a second region 12 that extends to the second opening 7b in the through hole 7, and a third region 13 that faces the main surface 2b of the semiconductor substrate 2 outside the through hole 7.

The first region 11 is a tapered region that gradually widens from the main surface 2a to the main surface 2b of the semiconductor substrate 2. The first region 11 has an average inclination angle α. When attention is paid to a region on one side of the center line CL in the plane including the center line CL of the through hole 7, the average inclination angle α of the first region 11 is the average value of the angle formed between the main surface 2a and an intersection line between the plane and the first region 11. When the intersection line is a straight line, the angle formed between the straight line and the main surface 2a is the average inclination angle α of the first region 11. When the intersection line is a curve, the average value of the angle formed between a line tangent to the curve and the main surface 2a is the average inclination angle α of the first region 11. The average inclination angle α of the first region 11 is greater than 0° and is less than 90°.

The second region 12 is a tapered region that gradually widens from the main surface 2a to the main surface 2b of the semiconductor substrate 2. The second region 12 has an average inclination angle β. When attention is paid to a region on one side of the center line CL in the plane including the center line CL of the through hole 7, the average inclination angle β of the second region 12 is the average value of the angle foamed between the main surface 2a and an intersection line between the plane and the second region 12. When the intersection line is a straight line, the angle formed between the straight line and the main surface 2a is the average inclination angle β of the second region 12. When the intersection line is a curve, the average value of the angle formed between a line tangent to the curve and the main surface 2a is the average inclination angle β of the second region 12. The average inclination angle β of the second region 12 is greater than 0° and is less than 90°.

The average inclination angle β of the second region 12 is less than the average inclination angle α of the first region 11. That is, the second region 12 has a gentler slope than the first region 11. In addition, the average inclination angle β of the second region 12 is less than an average inclination angle γ (in this case, 90°) of the inner surface 7c of the through hole 7. That is, the second region 12 has a gentler slope than the inner surface 7c of the through hole 7. In this embodiment, the average inclination angle α of the first region 11 is closer to the average inclination angle γ of the inner surface 7c of the through hole 7 than to the average inclination angle β of the second region 12. Here, the average inclination angle γ of the inner surface 7c of the through hole 7>the average inclination angle α of the first region 11>the average inclination angle β of the second region 12 is established. When attention is paid to a region on one side of the center line CL in the plane including the center line CL of the through hole 7, the average inclination angle γ of the inner surface 7c of the through hole 7 is the average value of the angle formed between the main surface 2a and an intersection line between the plane and the inner surface 7c. When the intersection line is a straight line, the angle formed between the straight line and the main surface 2a is the average inclination angle γ of the inner surface 7c of the through hole 7. When the intersection line is a curve, the average value of the angle formed between a line tangent to the curve and the main surface 2a is the average inclination angle γ of the inner surface 7c of the through hole 7.

The surface 10b of the insulating layer 10 further includes a fourth region 14 and a fifth region 15. The first region 11 is closer to the first opening 7a of the through hole 7 (closer to the first opening 7a in a direction parallel to the center line CL of the through hole 7) than the fourth region 14 in the surface 10b of the insulating layer 10 provided on the inner surface 7c of the through hole 7. The second region 12 is closer to the second opening 7b of the through hole 7 (closer to the second opening 7b in a direction parallel to the center line CL of the through hole 7) than the fourth region 14 in the surface 10b of the insulating layer 10 provided on the inner surface 7c of the through hole 7 and is provided between the fourth region 14 and the fifth region 15.

The fourth region 14 is curved so as to continuously connect the first region 11 and the second region 12. That is, the fourth region 14 is a rounded curved surface and smoothly connects the first region 11 and the second region 12. Here, when the first region 11 extends to the main surface 2b of the semiconductor substrate 2 and the second region 12 extends to the main surface 2a of the semiconductor substrate 2, assuming that the fourth region 14 is not provided, an intersection line (a corner or an angulated portion) is formed by the first region 11 and the second region 12. The fourth region 14 corresponds to a curved surface that is formed when the intersection line (a corner or an angulated portion) is R-chamfered. When attention is paid to a region on one side of the center line CL in the plane including the center line CL of the through hole 7, the fourth region 14 is a portion that is curved in a convex shape toward the side opposite the inner surface 7c of the through hole 7 between a portion corresponding to the first region 11 and a portion corresponding to the second region 12 in the intersection line between the plane and the surface 10b.

The fifth region 15 is curved along the edge of the second opening 7b of the through hole 7 so as to continuously connect the second region 12 and the third region 13. That is, the fifth region 15 is a rounded curved surface and smoothly connects the second region 12 and the third region 13. Here, when the second region 12 extends to the main surface 2b of the semiconductor substrate 2 and the third region 13 extends to the center line CL of the through hole 7, assuming that the fifth region 15 is not provided, an intersection line (for example, a corner or an angulated portion) is formed by the second region 12 and the third region 13. The fifth region 15 corresponds to a curved surface that is formed when the intersection line (for example, a corner or an angulated portion) is R-chamfered. When attention is paid to a region on one side of the center line CL in the plane including the center line CL of the through hole 7, the fifth region 15 is a portion that is curved in a convex shape toward the side opposite the edge of the second opening 7b of the through hole 7 between a portion corresponding to the second region 12 and a portion corresponding to the third region 13 in the intersection line between the plane and the surface 10b.

In this embodiment, at least the fourth region 14, the second region 12, and the fifth region 15 are curved surfaces that are curved in a convex shape toward the side opposite the inner surface 7c of the through hole 7. The third region 13 is a plane that is substantially parallel to the main surface 2b of the semiconductor substrate 2. As described above, the fourth region 14 is curved so as to continuously connect the first region 11 and the second region 12 and the fifth region 15 is curved so as to continuously connect the second region 12 and the third region 13. Therefore, the surface 10b of the insulating layer 10 is a continuous surface (a surface that does not have a discontinuous portion, such as an intersection line (for example, a corner or an angulated portion) between surfaces, and in which the regions 11, 12, 13, 14, and 15 are smoothly connected to each other).

The average thickness of the insulating layer 10 provided on the inner surface 7c of the through hole 7 is greater than the average thickness of the insulating layer 10 provided on the main surface 2b of the semiconductor substrate 2. The average thickness of the insulating layer 10 provided on the inner surface 7c of the through hole 7 is the average value of the thickness of the insulating layer 10 in a direction perpendicular to the inner surface 7c. The average thickness of the insulating layer 10 provided on the main surface 2b of the semiconductor substrate 2 is the average value of the thickness of the insulating layer 10 in a direction perpendicular to the main surface 2b.

The average thickness of a portion of the insulating layer 10 that corresponds to the first region 11 in a direction parallel to the main surfaces 2a and 2b of the semiconductor substrate 2 is greater than the average thickness of a portion of the insulating layer 10 that corresponds to the second region 12. The average thickness of the portion of the insulating layer 10 that corresponds to the first region 11 in the direction parallel to the main surfaces 2a and 2b of the semiconductor substrate 2 is the average value of the distance between the first region 11 and the inner surface 7c of the through hole 7 in the direction. The average thickness of the portion of the insulating layer 10 that corresponds to the second region 12 in the direction parallel to the main surfaces 2a and 2b of the semiconductor substrate 2 is the average value of the distance between the second region 12 and the inner surface 7c of the through hole 7 in the direction.

In the insulating layer 10, the first region 11 is the surface of a portion that has a height H from the main surface 2a of the semiconductor substrate 2 in the insulating layer 10 provided on the inner surface 7c of the through hole 7. The height H is equal to or less than two thirds of the sum D of the thickness of the semiconductor substrate 2 (that is, the distance between the main surface 2a and the main surface 2b) and the average thickness of the insulating layer 10 provided on the main surface 2b of the semiconductor substrate 2.

When a surface S that passes through the edge of the opening 10a of the insulating layer 10 and the edge of the second opening 7b of the through hole 7 in the insulating layer 10 is a boundary surface and attention is paid to a portion P1 on the inner surface 7c side of the through hole 7 with respect to the surface S and a portion P2 on the side opposite the inner surface 7c of the through hole 7 with respect to the surface S, the volume of the portion P1 is greater than the volume of the portion P2. In addition, when attention is paid to a region on one side of the center line CL in the plane including the center line CL of the through hole 7 in the insulating layer 10, the area of a triangle T1 is greater than the area of the triangle T2. The triangle T1 has, as vertices, the edge of the first opening 7a of the through hole 7, the edge of the second opening 7b of the through hole 7, and the edge of the opening 10a of the insulating layer 10 in the plane including the center line CL of the through hole 7 (that is, in the cross section illustrated in FIG. 8). The triangle T2 has, as vertices, the edge of the opening 10a of the insulating layer 10, the edge of the second opening 7b of the through hole 7, and the apex of the fourth region 14 in the plane including the center line CL of the through hole 7 (that is, in the cross section illustrated in FIG. 8).

Here, a case in which attention is paid to regions on both sides of the center line CL in the plane including the center line CL of the through hole 7 will be described. As illustrated in FIG. 9, it is assumed that a point corresponding to the edge of the opening 10a of the insulating layer 10 is a first point X1, a point corresponding to the edge of the second opening 7b of the through hole 7 is a second point X2, an intersection point between the second opening 7b of the through hole 7 (that is, an extension line of the main surface 2b) and the surface 10b of the insulating layer 10 is a third point X3, and a point corresponding to the edge of the first opening 7a of the through hole 7 is a fourth point X4. In addition, it is assumed that a segment connecting the first point X1 and the second point X2 is a first segment S1, a segment connecting the second point X2 and the third point X3 is a second segment S2, and a segment connecting the third point X3 and the first point X1 is a third segment S3.

In this case, a first area A1 of the insulating layer 10 that is located on the inner surface 7c side of the through hole 7 with respect to the first segment S1 is larger than the sum of a second area A2 of the insulating layer 10 that is surrounded by the first segment S1, the second segment S2, and the third segment S3 and a third area A3 of the insulating layer 10 that is located on the side opposite the inner surface 7c of the through hole 7 with respect to the third segment S3.

An inclination angle $\theta 1$ of the surface 10b of the insulating layer 10 at the first point X1 is greater than an inclination angle $\theta 2$ of the surface 10b of the insulating layer 10 at the third point X3. When attention is paid to a region on one side of the center line CL in the plane including the center line CL of the through hole 7, the inclination angle $\theta 1$ of the surface 10b of the insulating layer 10 at the first point X1 is an angle formed between the main surface 2a and a straight line (tangent line) tangent to the intersection line between the plane and the surface 10b of the insulating layer 10 at the first point X1. The inclination angle $\theta 1$ is greater than 0° and is less than 90°. When attention is paid to a region on one side of the center line CL in the plane including the center line CL of the through hole 7, the inclination angle $\theta 2$ of the surface 10b of the insulating layer 10 at the third point X3 is an angle formed between the main surface 2a and a straight line (tangent line) tangent to the intersection line between the plane and the surface 10b of the insulating layer 10 at the third point X3. The inclination angle $\theta 2$ is greater than 0° and is less than 90°.

An average inclination angle $\theta$ of the surface 10b of the insulating layer 10 provided on the inner surface 7c of the through hole 7 is less than the average inclination angle $\gamma$ of the inner surface 7c of the through hole 7. When attention is paid to a region on one side of the center line CL in the plane including the center line CL of the through hole 7, the average inclination angle $\theta$ of the surface 10b of the insulating layer 10 provided on the inner surface 7c of the through hole 7 is the average value of an angle formed between the main surface 2a and an intersection line between the plane and the surface 10b of the insulating layer 10 provided on the inner surface 7c of the through hole 7 (that is, the surface 10b of the insulating layer 10 that is located between the first opening 7a and the second opening 7b). The average inclination angle $\theta$ is greater than 0° and is less than 90°. The average inclination angle $\gamma$ of the inner surface 7c of the through hole 7 has been described above.

A distance D1 between the first point X1 and the fourth point X4 is greater than the width W of the opening 10a of the insulating layer 10. In addition, the width of the opening 10a of the insulating layer 10 means the distance between the opposite sides of the opening 10a when the opening 10a has a rectangular shape and means the diameter of the opening 10a when the opening 10a has a circular shape. A distance D2 between the edge of the first opening 7a of the through hole 7 and the edge of the opening 10a of the insulating layer 10 is greater than a distance D3 between the edge of the first opening 7a of the through hole 7 and the edge of the pad portion 3a of the first wiring 3.

[Function and Effect]

In the semiconductor device 1, as illustrated in FIG. 9, the insulating layer 10 is provided such that the first area A1 is larger than the sum of the second area A2 and the third area A3 and the third area A3 is present when attention is paid to regions on both sides of the center line CL in the plane including the center line CL of the through hole 7. Therefore, the average inclination angle of the surface of a portion of the insulating layer 10 that covers the edge of the second opening 7b of the through hole 7 is small (that is, the surface is gentle) and the thickness of the portion is ensured. Therefore, when the through hole 7 is a vertical hole, for example, the breaking of the second wiring 8 and the leakage of a current between the second wiring 8 and the semiconductor substrate 2 that are likely to occur in the vicinity of the second opening 7b of the through hole 7 are prevented. In addition, since the through hole 7 is a vertical hole, the percentage of the volume of the through hole 7 in the semiconductor substrate 2 is less than that when the through hole 7 is a tapered hole that gradually widens from the main surface 2a to the main surface 2b of the semiconductor substrate 2. The reason is that, when the area of the first opening 7a of the through hole 7 that needs to be minimized in order to connect the first wiring 3 and the second wiring 8 is constant, the vertical hole hardly becomes wider from the main surface 2a to the main surface 2b of the semiconductor substrate 2 while the tapered hole gradually becomes wider from the main surface 2a to the main surface 2b of the semiconductor substrate 2. As described above, according to the semiconductor device 1, it is possible to reliably ensure an electrical connection through the through hole 7 in the semiconductor substrate 2 while reducing the percentage of the volume of the through hole 7 in the semiconductor substrate 2.

In the semiconductor device 1, the inclination angle $\theta 1$ of the surface 10b of the insulating layer 10 at the first point X1 is greater than the inclination angle $\theta 2$ of the surface 10b of the insulating layer 10 at the third point X3. Therefore, for example, even when the diameter of the through hole 7 is reduced, it is possible to sufficiently ensure the size of the opening 10a of the insulating layer 10 in the main surface 2a of the semiconductor substrate 2 while maintaining the average inclination angle of the surface 10b of a portion of the insulating layer 10, that covers the edge of the second opening 7b of the through hole 7, at a small value (that is, at a shallow angle). As a result, it is possible to prevent the breaking of the second wiring 8 in the portion of the insulating layer 10 that covers the edge of the second opening 7b of the through hole 7 and to prevent the breaking of the first wiring 3 and the second wiring 8 in the opening 10a of the insulating layer 10.

In the semiconductor device 1, the average inclination angle $\theta$ of the surface 10b of the insulating layer 10 provided on the inner surface 7c of the through hole 7 is less than the average inclination angle $\gamma$ of the inner surface 7c of the through hole 7. Therefore, for example, it is possible to more easily and reliably form the second wiring 8 from the second opening 7b of the semiconductor substrate 2 than that when the insulating layer 10 is formed with a uniform thickness along the inner surface 7c of the through hole 7.

In the semiconductor device 1, the distance D1 between the first point X1 and the fourth point X4 is greater than the width W of the opening 10a of the insulating layer 10. For example, when the opening 10a is formed in the insulating layer 10 from the second opening 7b of the semiconductor substrate 2, the opening 10a of the insulating layer 10 that is provided in the main surface 2a is separated from the main surface 2b of the semiconductor substrate 2. Therefore, for example, a variation in the size or position of the opening 10a is likely to occur. Since the distance D1 between the first point X1 and the fourth point X4 is greater than the width W of the opening 10a of the insulating layer 10 that is provided in the main surface 2a, it is possible to increase a margin for the variation in, for example, the size or position of the opening 10a. In addition, since the distance D1 between the first point X1 and the fourth point X4 is large, it is easy to design the insulating layer 10 such that a portion of the insulating layer 10, that covers the edge of the second opening 7b of the through hole 7, is thick and the average inclination angle of the surface 10b of the portion of the insulating layer 10, that covers the edge of the second opening 7b of the through hole 7, is small.

In the semiconductor device 1, the distance D2 between the edge of the first opening 7a of the through hole 7 and the edge of the opening 10a of the insulating layer 10 is greater than the distance D3 between the edge of the first opening 7a of the through hole 7 and the edge of the pad portion 3a of the first wiring 3. As described above, when the opening 10a is formed in the insulating layer 10 from the second opening 7b of the semiconductor substrate 2, a variation in, for example, the size or position of the opening 10a is likely to occur. However, since the distance D1 between the edge of the first opening 7a and the edge of the opening 10a of the insulating layer 10 is greater than the distance D3 between the edge of the first opening 7a and the edge of the pad portion 3a, it is possible to increase a margin for the variation in, for example, the size or position of the opening 10a. In addition, since the distance D1 between the first point X1 and the fourth point X4 is large, it is easy to design the insulating layer 10 such that a portion of the insulating layer 10, that covers the edge of the second opening 7b of the through hole 7, is thick and the average inclination angle of the surface 10b of the portion of the insulating layer 10, that covers the edge of the second opening 7b of the through hole 7, is small.

When at least one of the condition in which the distance D1 between the first point X1 and the fourth point X4 is greater than the width W of the opening 10a of the insulating layer 10 and the condition in which the distance D2 between the edge of the first opening 7a of the through hole 7 and the edge of the opening 10a of the insulating layer 10 is greater than the distance D3 between the edge of the first opening 7a of the through hole 7 and the edge of the pad portion 3a of the first wiring 3 is satisfied, the above-mentioned effect is obtained in the portion in which the condition is satisfied.

In the semiconductor device 1, the aspect ratio that is a value obtained by dividing the depth of the through hole 7 by the width of the second opening 7b is equal to or less than 1. Therefore, it is possible to easily and reliably form the second wiring 8 on the surface 10b of the insulating layer 10. In addition, since the average inclination angle of the surface 10b of the portion of the insulating layer 10, that covers the edge of the second opening 7b, is small (that is, the surface 10b is gentle), it is possible to reliably prevent the second wiring 8 from being broken in the portion. Furthermore, it is possible to easily and reliably form the opening 10a in the insulating layer 10.

In the semiconductor device 1, the insulating layer 10 is made of a resin. Therefore, it is possible to easily and reliably form the insulating layer 10 having the above-mentioned shape.

In the semiconductor device 1, the surface 10b of the insulating layer 10 provided on the inner surface 7c of the through hole 7 is a continuous surface. Therefore, since the concentration of stress on the entire region of the surface 10b of the insulating layer 10 is reduced, it is possible to reliably prevent the second wiring 8 from being broken.

In the semiconductor device 1, the surface 10b of the insulating layer 10 provided on the inner surface 7c of the through hole 7 and the surface 10b of the insulating layer 10 provided on the main surface 2b are continuous surfaces. Therefore, since the thickness of the portion of the insulating layer 10, that covers the edge of the second opening 7b of the through hole 7, is ensured, it is possible to prevent the leakage of a current between the second wiring 8 and the semiconductor substrate 2 in the vicinity of the second opening 7b. In addition, since the surface 10b of the portion of the insulating layer 10, that covers the edge of the second opening 7b of the through hole 7, is smooth, it is possible to prevent the second wiring 8 from being broken in the vicinity of the second opening 7b.

In the semiconductor device 1, a plurality of avalanche photodiodes APD that operate in the Geiger mode are provided in the semiconductor substrate 2. In the semiconductor device 1, it is preferable to increase the percentage of the area of a plurality of pixels (corresponding to the avalanche photodiodes APD) in the light receiving surface. However, when the through hole 7 is provided in each avalanche photodiode APD, it is desirable to reduce the percentage of the volume of the through holes 7 in the semiconductor substrate 2. In addition, it is desirable to prevent, for example, the breaking of a wiring in the through hole 7 and to reliably ensure an electrical connection through the through hole 7 in the semiconductor substrate 2. In particular, in the semiconductor device 1, since an operating voltage applied to the avalanche photodiode APD is high, it is desirable to reliably insulate the wiring in the through hole 7 from the semiconductor substrate 2. According to the semiconductor device 1, as described above, it is possible to reliably ensure an electrical connection through the through hole 7 in the semiconductor substrate 2 while reducing the percentage of the volume of the through holes 7 in the semiconductor substrate 2. Therefore, it is possible to reduce the percentage of the volume of the through holes 7 in the semiconductor substrate 2, to reliably ensure an electrical connection through the through hole 7 in the semiconductor substrate 2, and to reliably insulate the wiring in the through hole 7 from the semiconductor substrate 2.

[Modification Examples]

An embodiment of the invention has been described above. However, the invention is not limited to the above-described embodiment. For example, the insulating layer 10 may be made of an insulating material other than a resin. In addition, in the above-described embodiment, the first opening 7a of the through hole 7 is covered by the pad portion 3a of the first wiring 3. However, a portion of the first wiring 3 may be located above the first opening 7a or the first wiring 3 may not cover the entire region of the first opening 7a. In addition, the lead electrode 9 may be provided in the through hole 7 so as to protrude from the main surface 2b of the semiconductor substrate 2. In this case, the lead electrode 9 is electrically connected to the second wiring 8 that is formed on the surface 10b of the insulating layer 10 provided on the inner surface 7c of the through hole 7. Therefore, in this case, the second wiring 8 may not be formed on the surface 10b of the insulating layer 10 provided on the main surface 2b of the semiconductor substrate 2.

The mounting substrate 120 may have an active quenching circuit, instead of the passive quenching circuit (quenching resistor). In this case, the common electrode CE and the signal line TL are connected to each active quenching circuit. Each active quenching circuit includes a CMOS circuit and also functions as the signal processing unit SP.

The active quenching circuit converts an output signal from each avalanche photodiode APD into a digital pulse and turns on and off a MOS, using the converted digital pulse, to perform an operation of forcibly dropping a voltage and a reset operation. Since the mounting substrate 120 includes the active quenching circuit, it is possible to reduce a voltage recovery time when the semiconductor photodetection element 110 operates in the Geiger mode.

The shape of each of the first semiconductor region 1PA and the second semiconductor region 1PB is not limited to the above-mentioned shape and the regions may have other shapes (for example, a circular shape). In addition, for example, the number of avalanche photodiodes APD (the number of rows and the number of columns) formed in the semiconductor substrate 2 and the arrangement thereof are not limited to the above-mentioned number and arrangement.

In the above-described embodiment, the side surface 2c of the semiconductor substrate 2 is flush with the side surface 120c of the mounting substrate 120. However, the invention is not limited thereto. For example, the outer edge of the mounting substrate 120 may be located outside the outer edge of the semiconductor substrate 2 in a plan view. In this case, the semiconductor substrate is electrically connected to the outside through a wiring pad that is formed in a peripheral portion of the main surface 120a of the mounting substrate 120 by wiring bonding and processed information is output to the outside.

[Semiconductor Device According to Reference Embodiment]

A semiconductor device 1 according to a reference embodiment will be described with reference to FIGS. 10 to 17. In the semiconductor device 1 according to the above-described embodiment, the through hole 7 and a peripheral portion thereof can be manufactured by the same method as a through hole 7 and a peripheral portion thereof in the semiconductor device 1 according to the reference embodiment that will be described below.

As illustrated in FIG. 10, the semiconductor device 1 includes a semiconductor substrate 2 having a main surface 2a and a main surface 2b that are opposite to each other. The semiconductor device 1 is an optical device such as a color sensor. For example, a device is formed on the main surface 2a of the semiconductor substrate 2 made of silicon. A first wiring 3 that is made of, for example, aluminum is provided on the main surface 2a of the semiconductor substrate 2, with an oxide film 4 interposed therebetween. In the oxide film 4, an opening 4a is formed in a portion corresponding to a pad portion 3a of the first wiring 3. A light transmissive substrate 5 that is made of, for example, glass is attached to the main surface 2a of the semiconductor substrate 2, with an adhesive layer 6 interposed therebetween.

A through hole 7 to extend from the main surface 2a to the main surface 2b is formed in the semiconductor substrate 2. A first opening 7a of the through hole 7 is provided in the main surface 2a of the semiconductor substrate 2 and a second opening 7b of the through hole 7 is provided in the main surface 2b of the semiconductor substrate 2. The first opening 7a is continuous with the opening 4a of the oxide film 4 and is covered by the pad portion 3a of the first wiring 3. An inner surface 7c of the through hole 7 has a tapered surface that gradually widens from the main surface 2a to the main surface 2b. For example, the through hole 7 has a truncated square pyramid shape that gradually widens from the main surface 2a to the main surface 2b. The edge of the first opening 7a of the through hole 7 and the edge of the opening 4a of the oxide film 4 do not need to be aligned with each other, as viewed from a direction parallel to a center line CL of the through hole 7. For example, the edge of the opening 4a of the oxide film 4 may be located inside the edge of the first opening 7a of the through hole 7.

The aspect ratio of the through hole 7 is in the range of 0.2 to 10. The aspect ratio is a value obtained by dividing the depth of the through hole 7 (the distance between the first opening 7a and the second opening 7b) by the width of the second opening 7b (the distance between opposite sides of the second opening 7b when the second opening 7b has a rectangular shape and the diameter of the second opening 7b when the second opening 7b has a circular shape). For example, the depth of the through hole 7 is 30 μm and the depth of the second opening 7b is 130 μm. In this case, the aspect ratio is 0.23.

An insulating layer 10 is provided on the inner surface 7c of the through hole 7 and the main surface 2b of the semiconductor substrate 2. The insulating layer 10 is continuous through the second opening 7b of the through hole 7. The insulating layer 10 extends to the pad portion 3a of the first wiring 3 through the opening 4a of the oxide film 4 in the through hole 7 and has an opening 10a provided in the main surface 2a of the semiconductor substrate 2. A second wiring 8 that is made of, for example, aluminum is provided on a surface 10b of the insulating layer 10 (a surface opposite to the inner surface 7c of the through hole 7 and the main surface 2b of the semiconductor substrate 2). The second wiring 8 is electrically connected to the pad portion 3a of the first wiring 3 in the opening 10a of the insulating layer 10. The second wiring 8 is covered by a resin protective layer 21 except a pad portion 8a on which a lead electrode 9 that is a bump electrode is provided. In addition, a protective layer (for example, an oxide film or a nitride film) that is made of other insulating materials may be provided instead of the resin protective layer 21. The thickness of the resin protective layer 21 may be substantially equal to the thickness of the insulating layer 10 or may be less than the thickness of the insulating layer 10. In particular, when the thickness of the resin protective layer 21 is substantially equal to the thickness of the insulating layer 10, it is possible to reduce stress applied to the second wiring 8 and a third wiring 22.

Figure 11:
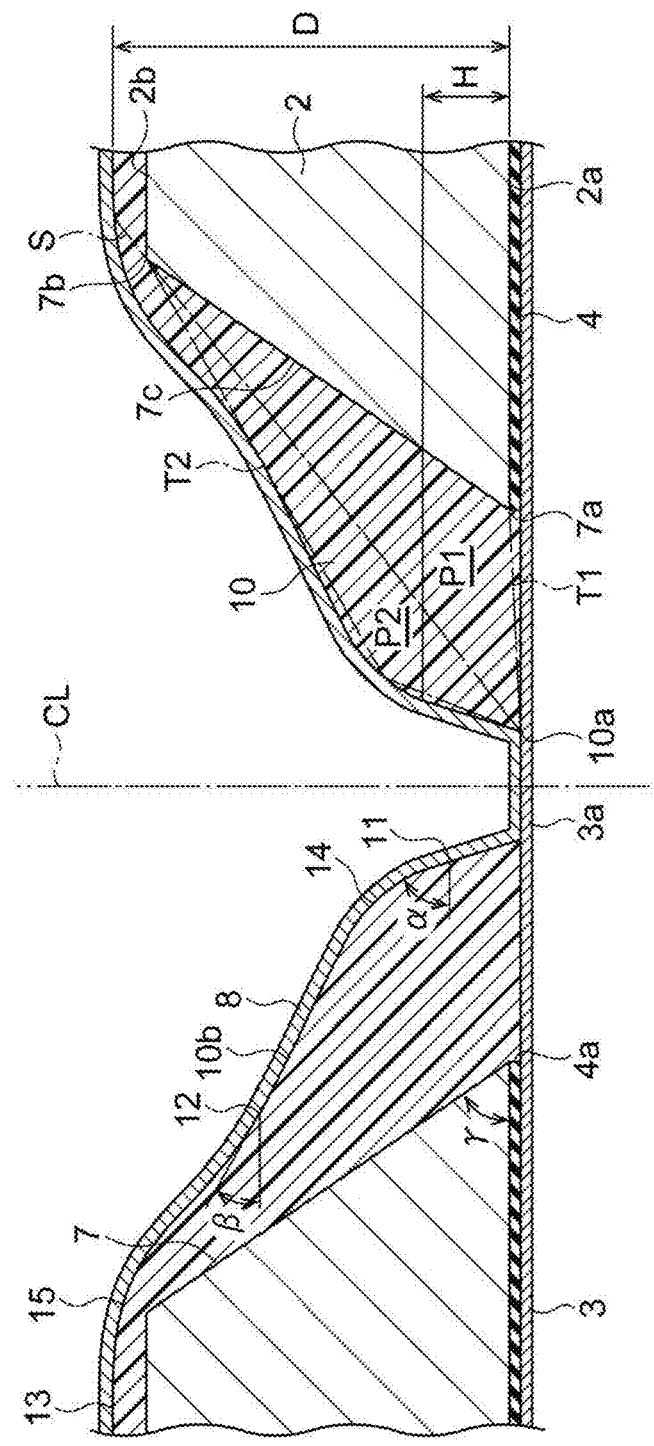
FIG. 11 is a cross-sectional view illustrating a through hole and a peripheral portion thereof in the semiconductor device illustrated in FIG. 10.

The insulating layer 10 will be described in detail with reference to FIG. 11. In FIG. 11, the light transmissive substrate 5, the adhesive layer 6, the lead electrode 9, and the resin protective layer 21 are not illustrated.

As illustrated in FIG. 11, the surface 10b of the insulating layer 10 includes a first region 11 that extends to the first opening 7a in the through hole 7, a second region 12 that extends to the second opening 7b in the through hole 7, and a third region 13 that faces the main surface 2b of the semiconductor substrate 2 outside the through hole 7.

The first region 11 is a tapered region that gradually widens from the main surface 2a to the main surface 2b of the semiconductor substrate 2. The first region 11 has an average inclination angle α. When attention is paid to a region on one side of the center line CL in the plane including the center line CL of the through hole 7, the average inclination angle α of the first region 11 is the average value of the angle formed between the main surface 2a and an intersection line between the plane and the first region 11. When the intersection line is a straight line, the angle formed between the straight line and the main surface 2a is the average inclination angle α of the first region 11. When the intersection line is a curve, the average value of the angle formed between a line tangent to the curve and the main surface 2a is the average inclination angle α of the first region 11. The average inclination angle α of the first region 11 is greater than 0° and is less than 90°.

The second region 12 is a tapered region that gradually widens from the main surface 2a to the main surface 2b of the semiconductor substrate 2. The second region 12 has an average inclination angle β. When attention is paid to a region on one side of the center line CL in the plane including the center line CL of the through hole 7, the average inclination angle β of the second region 12 is the average value of the angle formed between the main surface 2a and an intersection line between the plane and the second region 12. When the intersection line is a straight line, the angle formed between the straight line and the main surface 2a is the average inclination angle β of the second region 12. When the intersection line is a curve, the average value of the angle formed between a line tangent to the curve and the main surface 2a is the average inclination angle β of the second region 12. The average inclination angle β of the second region 12 is greater than 0° and is less than 90°.

The average inclination angle β of the second region 12 is less than the average inclination angle α of the first region 11. That is, the second region 12 has a gentler slope than the first region 11. In addition, the average inclination angle β of the second region 12 is less than an average inclination angle γ of the inner surface 7c of the through hole 7. That is, the second region 12 has a gentler slope than the inner surface 7c of the through hole 7. In this embodiment, the average inclination angle α of the first region 11 is closer to the average inclination angle γ of the inner surface 7c of the through hole 7 than to the average inclination angle β of the second region 12. Here, the average inclination angle α of the first region 11>the average inclination angle γ of the inner surface 7c of the through hole 7>the average inclination angle β of the second region 12 is established. When attention is paid to a region on one side of the center line CL in the plane including the center line CL of the through hole 7, the average inclination angle γ of the inner surface 7c of the through hole 7 is the average value of the angle formed between the main surface 2a and an intersection line between the plane and the inner surface 7c. When the intersection line is a straight line, the angle formed between the straight line and the main surface 2a is the average inclination angle γ of the inner surface 7c of the through hole 7. When the intersection line is a curve, the average value of the angle formed between a line tangent to the curve and the main surface 2a is the average inclination angle γ of the inner surface 7c of the through hole 7.

The surface 10b of the insulating layer 10 further includes a fourth region 14 that is convex to the side opposite the inner surface 7c of the through hole 7 and has the maximum curvature and a fifth region 15 that is provided along the edge of the second opening 7b of the through hole 7. When attention is paid to a region on one side of the center line CL in the plane including the center line CL of the through hole 7, the maximum curvature of the region that is convex to the side opposite the inner surface 7c of the through hole 7 is the maximum value of the curvature of a portion, that is curved in a convex shape toward the side opposite the inner surface 7c of the through hole 7, in an intersection line between the plane and the surface 10b. The first region 11 is closer to the first opening 7a of the through hole 7 than the fourth region 14 in the surface 10b of the insulating layer 10 provided on the inner surface 7c of the through hole 7. The second region 12 is closer to the second opening 7b of the through hole 7 than the fourth region 14 in the surface 10b of the insulating layer 10 provided on the inner surface 7c of the through hole 7 (that is, the second region 12 is provided between the fourth region 14 and the fifth region 15).

The fourth region 14 is curved so as to continuously connect the first region 11 and the second region 12. That is, the fourth region 14 is a rounded curved surface and smoothly connects the first region 11 and the second region 12. Here, when the first region 11 extends to the main surface 2b of the semiconductor substrate 2 and the second region 12 extends to the main surface 2a of the semiconductor substrate 2, assuming that the fourth region 14 is not provided, an intersection line (a corner or an angulated portion) is formed by the first region 11 and the second region 12. The fourth region 14 corresponds to a curved surface that is formed when the intersection line (a corner or an angulated portion) is R-chamfered. When attention is paid to a region on one side of the center line CL in the plane including the center line CL of the through hole 7, the fourth region 14 is a portion that is curved in a convex shape toward the side opposite the inner surface 7c of the through hole 7 between a portion corresponding to the first region 11 and a portion corresponding to the second region 12 in the intersection line between the plane and the surface 10b.

The fifth region 15 is curved so as to continuously connect the second region 12 and the third region 13. That is, the fifth region 15 is a rounded curved surface and smoothly connects the second region 12 and the third region 13. Here, when the second region 12 extends to the main surface 2b of the semiconductor substrate 2 and the third region 13 extends to the center line CL of the through hole 7, assuming that the fifth region 15 is not provided, an intersection line (for example, a corner or an angulated portion) is formed by the second region 12 and the third region 13. The fifth region 15 corresponds to a curved surface that is formed when the intersection line (for example, a corner or an angulated portion) is R-chamfered. When attention is paid to a region on one side of the center line CL in the plane including the center line CL of the through hole 7, the fifth region 15 is a portion that is curved in a convex shape toward the side opposite the edge of the second opening 7b of the through hole 7 between a portion corresponding to the second region 12 and a portion corresponding to the third region 13 in the intersection line between the plane and the surface 10b.

In this embodiment, the first region 11, the fourth region 14, and the fifth region 15 are curved surfaces that are curved in a convex shape toward the side opposite the inner surface 7c of the through hole 7. The second region 12 is a curved surface that is curved in a convex shape toward the side opposite the inner surface 7c of the through hole 7 (that is, a curved surface that is curved in a concave shape when viewed from the side opposite the inner surface 7c of the through hole 7). The third region 13 is a plane that is substantially parallel to the main surface 2b of the semiconductor substrate 2. As described above, the fourth region 14 is curved so as to continuously connect the first region 11 and the second region 12 and the fifth region 15 is curved so as to continuously connect the second region 12 and the third region 13. Therefore, the surface 10b of the insulating layer 10 is a continuous surface (a surface that does not have a discontinuous portion, such as an intersection line (for example, a corner or an angulated portion) between surfaces, and in which the regions 11, 12, 13, 14, and 15 are smoothly connected to each other).

The average thickness of the insulating layer 10 provided on the inner surface 7c of the through hole 7 is greater than the average thickness of the insulating layer 10 provided on the main surface 2b of the semiconductor substrate 2. The average thickness of the insulating layer 10 provided on the inner surface 7c of the through hole 7 is the average value of the thickness of the insulating layer 10 in a direction perpendicular to the inner surface 7c. The average thickness of the insulating layer 10 provided on the main surface 2b of the semiconductor substrate 2 is the average value of the thickness of the insulating layer 10 in a direction perpendicular to the main surface 2b.

The average thickness of a portion of the insulating layer 10 that corresponds to the first region 11 in a direction parallel to the main surfaces 2a and 2b of the semiconductor substrate 2 is greater than the average thickness of a portion of the insulating layer 10 that corresponds to the second region 12. The average thickness of the portion of the insulating layer 10 that corresponds to the first region 11 in the direction parallel to the main surfaces 2a and 2b of the semiconductor substrate 2 is the average value of the distance between the first region 11 and the inner surface 7c of the through hole 7 in the direction. The average thickness of the portion of the insulating layer 10 that corresponds to the second region 12 in the direction parallel to the main surfaces 2a and 2b of the semiconductor substrate 2 is the average value of the distance between the second region 12 and the inner surface 7c of the through hole 7 in the direction.

In the insulating layer 10, the first region 11 is the surface of a portion, that has a height H from the main surface 2a of the semiconductor substrate 2, in the insulating layer 10 provided on the inner surface 7c of the through hole 7. The height H is equal to or less than half the sum D of the thickness of the semiconductor substrate 2 (that is, the distance between the main surface 2a and the main surface 2b) and the average thickness of the insulating layer 10 provided on the main surface 2b of the semiconductor substrate 2.

When a surface S that passes through the edge of the opening 10a of the insulating layer 10 and the edge of the second opening 7b of the through hole 7 in the insulating layer 10 is a boundary surface and attention is paid to a portion P1 on the inner surface 7c side of the through hole 7 with respect to the surface S and a portion P2 on the side opposite the inner surface 7c of the through hole 7 with respect to the surface S, the volume of the portion P1 is greater than the volume of the portion P2. In addition, when attention is paid to a region on one side of the center line CL in the plane including the center line CL of the through hole 7 in the insulating layer 10, the area of a triangle T1 is greater than the area of a triangle T2. The triangle T1 has, as vertices, the edge of the first opening 7a of the through hole 7, the edge of the second opening 7b of the through hole 7, and the edge of the opening 10a of the insulating layer 10 in the plane including the center line CL of the through hole 7 (that is, in the cross section illustrated in FIG. 11). The triangle T2 has, as vertices, the edge of the opening 10a of the insulating layer 10, the edge of the second opening 7b of the through hole 7, and the apex of the fourth region 14 in the plane including the center line CL of the through hole 7 (that is, in the cross section illustrated in FIG. 11).

As described above, in the semiconductor device 1, the first region 11 that extends to the first opening 7a of the through hole 7 and the second region 12 that extends to the second opening 7b of the through hole 7 in the surface 10b of the insulating layer 10 are tapered regions that gradually widen from the main surface 2a to the main surface 2b of the semiconductor substrate 2. The average inclination angle of the second region 12 is less than the average inclination angle of the inner surface 7c of the through hole 7. Therefore, in the surface 10b of the insulating layer 10, the angle formed between the third region 13 that faces the main surface 2b of the semiconductor substrate 2 and the second region 12 that extends to the second opening 7b of the through hole 7 is greater than the angle formed between the main surface 2b of the semiconductor substrate 2 and the inner surface 7c of the through hole 7 (that is, the surface between the third region 13 and the second region 12 is gentler than the inner surface 7c). Therefore, both when the semiconductor device is manufactured and after the semiconductor device is manufactured, the breaking of the second wiring 8 in the second opening 7b of the through hole 7 is prevented. In addition, for example, since the slope of the second region 12 is gentler than that When the insulating layer 10 is formed with a uniform thickness along the inner surface 7c of the through hole 7, it is possible to more easily and reliably from the second wiring 8. Furthermore, it is possible to form the second wiring 8, without depending on the shape of the inner surface 7c of the through hole 7. Therefore, for example, even when a sharp portion remains on the inner surface 7c of the through hole 7, it is possible to prevent the breaking of the second wiring 8 caused by the sharp portion. In addition, the average inclination angle of the second region 12 is less than the average inclination angle of the first region 11. In other words, the average inclination angle of the first region 11 that extends to the first opening 7a of the through hole 7 is greater than the average inclination angle of the second region 12. Therefore, for example, even when the diameter of the through hole 7 is reduced, it is possible to sufficiently ensure the size of the opening 10a of the insulating layer 10 in the main surface 2a of the semiconductor substrate 2. As a result, both when the semiconductor device is manufactured and after the semiconductor device is manufactured, the breaking of the first wiring 3 and the second wiring 8 in the opening 10a of the insulating layer 10 is prevented. In the surface 10b of the insulating layer 10, the fourth region 14 is curved so as to continuously connect the first region 11 and the second region 12 and the fifth region 15 is curved so as to continuously connect the second region 12 and the third region 13. Therefore, both when the semiconductor device is manufactured and after the semiconductor device is manufactured, the breaking of the second wiring 8 in the entire region of the surface 10b of the insulating layer 10 is prevented. In particular, after the semiconductor device is manufactured, the concentration of stress on the entire region of the surface 10b of the insulating layer 10 is reduced. Therefore, the above-mentioned structure is effective in preventing the breaking of the second wiring 8. Therefore, according to the semiconductor device 1, it is possible to reliably ensure an electrical connection through the through hole 7 in the semiconductor substrate 2.

In the semiconductor device 1, the surface 10b of the insulating layer 10 is a continuous surface (a surface that does not have a discontinuous portion, such as an intersection line (for example, a corner or an angulated portion) between surfaces, and in which the regions 11, 12, 13, 14, and 15 are smoothly connected to each other). Therefore, the concentration of stress is reduced and it is possible to prevent the second wiring 8 from being broken.

In the semiconductor device 1, the average inclination angle of the first region 11 is closer to the average inclination angle of the inner surface 7c of the through hole 7 than to the average inclination angle of the second region 12. Therefore, it is possible to obtain the opening 10a with a sufficient size to expose the pad portion 3a of the first wiring 3. As a result, both when the semiconductor device is manufactured and after the semiconductor device is manufactured, it is possible to reliably prevent the breaking of the first wiring 3 and the second wiring 8 in the opening 10a of the insulating layer 10.

In the semiconductor device 1, the average inclination angle $\alpha$ of the first region 11 > the average inclination angle $\gamma$ of the inner surface 7c of the through hole 7 > the average inclination angle $\beta$ of the second region 12 is established. Therefore, it is possible to prevent the second wiring 8 from being broken and to obtain the opening 10a with a sufficient size to expose the pad portion 3a of the first wiring 3.

In the semiconductor device 1, the average thickness of the insulating layer 10 provided on the inner surface 7c of the through hole 7 is greater than the average thickness of the insulating layer 10 provided on the main surface 2b. Therefore, for example, even when the thickness of the semiconductor substrate 2 is reduced, it is possible to sufficiently ensure the strength of a peripheral portion of the through hole 7 since the insulating layer 10 provided on the inner surface 7c of the through hole 7 functions as a reinforcement layer. In addition, it is possible to set the average inclination angle of the first region 11 and the average inclination angle of the second region 12 to desired angles and to obtain the insulating layer 10 in which the surface 10b is a continuous surface (a surface that does not have a discontinuous portion, such as an intersection line (for example, a corner or an angulated portion) between surfaces, and in which the regions 11, 12, 13, 14, and 15 are smoothly connected to each other). For example, when the insulating layer 10 is formed with a uniform thickness along the inner surface 7c of the through hole 7, it is impossible to obtain the insulating layer 10 in which the surface 10b is a continuous surface.

In the semiconductor device 1, the average thickness of a portion of the insulating layer 10 that corresponds to the first region 11 in a direction parallel to the main surfaces 2a and 2b of the semiconductor substrate 2 is greater than the average thickness of a portion of the insulating layer 10 that corresponds to the second region 12. Therefore, it is possible to obtain the insulating layer 10 with a shape in which the second wiring 8 is less likely to be broken and the first wiring 3 and the second wiring 8 are less likely to be broken.

In the semiconductor device 1, for example, when an overhang remains at the edge of the second opening 7b of the through hole 7, the overhang is covered by the insulating layer 10 and the second wiring 8 is provided in the fifth region 15 that is a curved surface that is curved in a convex shape. Therefore, it is possible to reliably prevent the second wiring 8 from being broken in the second opening 7b of the through hole 7.

In the semiconductor device 1, in the insulating layer 10 provided on the inner surface 7c of the through hole 7, the surface of a portion having a height H that is equal to or less than half the sum D of the thickness of the semiconductor substrate 2 and the average thickness of the insulating layer 10 provided on the main surface 2b is the first region 11. Therefore, in the surface 10b of the insulating layer 10, the first region 11 and the second region 12 are gently connected to each other and it is possible to reliably prevent the breaking of the second wiring 8 at the boundary between the first region 11 and the second region 12.

In the insulating layer 10 of the semiconductor device 1, when the surface S that passes through the edge of the opening 10a of the insulating layer 10 and the edge of the second opening 7b of the through hole 7 is a boundary surface and attention is paid to the portion P1 on the inner surface 7c side of the through hole 7 with respect to the surface S and the portion P2 on the side opposite the inner surface 7c of the through hole 7 with respect to the surface S, the volume of the portion P1 is greater than the volume of the portion P2. In addition, when attention is paid to a region on one side of the center line CL in the plane including the center line CL of the through hole 7 in the insulating layer 10, the area of the triangle T1 is greater than the area of the triangle T2. According to this structure, in the surface 10b of the insulating layer 10, the first region 11 and the second region 12 are gently connected to each other and it is possible to reliably prevent the breaking of the second wiring 8 at the boundary between the first region 11 and the second region 12.

In the semiconductor device 1, in the surface 10b of the insulating layer 10 provided on the inner surface 7c of the through hole 7, a region that is closer to the first opening 7a than the fourth region 14 that is convex to the side opposite the inner surface 7c of the through hole 7 and has the maximum curvature is the first region 11 and a region that is closer to the second opening 7b than the fourth region 14 is the second region 12. The shape of the insulating layer 10 is particularly effective in reliably ensuring an electrical connection through the through hole 7 in the semiconductor substrate 2.

In the semiconductor device 1, the inner surface 7c of the through hole 7 is a tapered surface that gradually widens from the main surface 2a to the main surface 2b. In this case, it is also possible to reliably ensure an electrical connection through the through hole 7 in the semiconductor substrate 2.

Next, a method for manufacturing the semiconductor device 1 will be described with reference to FIGS. 12 to 14. First, the semiconductor substrate 2 is prepared and a device is formed on the main surface 2a of the semiconductor substrate 2 (that is, for example, the oxide film 4 and the first wiring 3 are provided on the main surface 2a) (first process). Then, the light transmissive substrate 5 is attached to the main surface 2a of the semiconductor substrate 2, with the adhesive layer 6 interposed therebetween.

Then, as illustrated in (a) of FIG. 12, the through hole 7 is formed in the semiconductor substrate 2 by anisotropic wet etching. As illustrated in (b) of FIG. 12, a portion of the oxide film 4 that corresponds to the pad portion 3a of the first wiring 3 is removed to form an opening 4a in the oxide film 4. Then, the pad portion 3a of the first wiring 3 is exposed through the first opening 7a of the through hole 7 (second process).

Then, a positive-type resin material with a viscosity of 10 cp or more is prepared and a deep coating method (a method that immerses a target material in resin paint and draws out the target material from the resin paint to form a resin layer on the target material) is performed using the resin material to provide the insulating layer 10 on the inner surface 7c of the through hole 7 and the main surface 2b of the semiconductor substrate 2, as illustrated in (a) of FIG. 13 (third process). In this way, a depressed portion 17 with an inner surface that follows the second region 12, the third region 13, and the fifth region 15 is formed in the insulating layer 10. For example, a phenol resin, a polyimide resin, or an epoxy resin can be used as the resin material.

Then, as illustrated in (b) of FIG. 13, a mask 30 is placed on the insulating layer 10 provided on the main surface 2b of the semiconductor substrate 2. The mask 30 includes a light transmissive portion 31 that is provided at a position facing the pad portion 3a of the first wiring 3 and a light shielding portion 32 that is provided around the light transmissive portion 31. Then, a portion of the insulating layer 10 that corresponds to a contact hole 16 is irradiated with light through the light transmissive portion 31 of the mask 30 and is exposed. In addition, the portion of the insulating layer 10 that corresponds to the contact hole 16 is developed to form the contact hole 16 in the insulating layer 10. In this way, the pad portion 3a of the first wiring 3 is exposed through the opening 10a of the insulating layer 10 (fourth process). When the contact hole 16 is formed, for example, an aching process may be used.

At the time of exposure, a gap is formed between the light transmissive portion 31 of the mask 30 and the portion of the insulating layer 10 that corresponds to the contact hole 16 by the depressed portion 17 formed in the insulating layer 10. Therefore, light is diffracted and the insulating layer 10 is irradiated with the diffracted light. Therefore, at the time of development, the contact hole 16 with an inner surface that follows the first region 11 and the second region 12 having a tapered shape that gradually widens from the main surface 2a to the main surface 2b of the semiconductor substrate 2.

Then, as illustrated in (a) of FIG. 14, for example, a sputtering method is performed using aluminum to provide the second wiring 8 on the surface 10b of the insulating layer 10 and the first wiring 3 and the second wiring 8 are electrically connected to each other in the opening 10a of the insulating layer 10 (fifth process). In this case, since the contact hole 16 has an inner surface following the first region 11 with a tapered shape that gradually widens from the main surface 2a to the main surface 2b of the semiconductor substrate 2, a metal film is reliably formed on the inner surface. Therefore, the first wiring 3 and the second wiring 8 are reliably connected to each other in the opening 10a of the insulating layer 10.

Then, for example, a deep coating method is performed using the same resin material as that used to form the insulating layer 10 to cover the second wiring 8 with the resin protective layer 21, as illustrated in (b) of FIG. 14. Finally, the lead electrode 9 is provided on the pad portion 8a of the second wiring 8 that is not covered with the resin protective layer 21. In this way, the semiconductor device 1 is obtained.

According to the method for manufacturing the semiconductor device 1, it is possible to effectively manufacture the semiconductor device 1 in which an electrical connection through the through hole 7 in the semiconductor substrate 2 is reliably ensured.

In the method for manufacturing the semiconductor device 1, a deep coating method is performed using a resin material with a viscosity of 10 cp or more to provide the insulating layer 10 on the inner surface 7c of the through hole 7 and the main surface 2b of the semiconductor substrate 2. Therefore, it is possible to easily and reliably obtain the insulating layer 10 having the above-mentioned shape.

In general, a resin material with low viscosity (for example, a resin material with a viscosity of 1 cp or less, such as a resin material used for water-repellent coating) is used in the deep coating method. However, even when the deep coating method is performed using the resin material, the insulating layer 10 is formed with a substantially uniform thickness along the inner surface 7c of the through hole 7. In the method for manufacturing the semiconductor device 1, since the deep coating method is performed using the resin material with a viscosity of 10 cp or more, it is possible to easily and reliably obtain the insulating layer 10 having the above-mentioned shape.

In the method for manufacturing the semiconductor device 1, the insulating layer 10 is provided on the inner surface 7c of the through hole 7 and the main surface 2b of the semiconductor substrate 2, using a positive-type resin material. A portion of the insulating layer 10 that corresponds to the contact hole 16 is exposed and developed to form the contact hole 16 in the insulating layer 10. Therefore, it is possible to easily and reliably obtain the insulating layer 10 having the above-mentioned shape. In addition, at the time of exposure and development, the thickness of a portion of the insulating layer 10 that corresponds to the contact hole 16 is reduced by the depressed portion 17 formed in the insulating layer 10 (that is, in the insulating layer 10, the portion corresponding to the contact hole 16 has a height H that is equal to or less than half the sum D of the thickness of the semiconductor substrate 2 and the average thickness of the insulating layer 10 provided on the main surface 2b). Therefore, it is possible to easily and reliably obtain the contact hole 16 having a desired shape.

In the method for manufacturing the semiconductor device 1, the deep coating method is performed, with the light transmissive substrate 5 attached to the semiconductor substrate 2. Therefore, it is possible to use the thinned semiconductor substrate 2. In the thinned semiconductor substrate 2, the depth of the through hole 7 is small. Therefore, even when the thick insulating layer 10 is formed by the deep coating method using a resin material with a high viscosity of 10 cp or more, it is possible to easily and reliably form the contact hole 16 in the insulating layer 10.

As illustrated in FIG. 15, the light transmissive substrate 5 may not be attached to the main surface 2a of the semiconductor substrate 2, with the adhesive layer 6 interposed therebetween. In this case, an oxide film 18 is provided on the main surface 2a so as to cover the first wiring 3. As such, when the light transmissive substrate 5 is not attached to the semiconductor substrate 2, a portion of the insulating layer 10 that has a height H from the main surface 2a functions as a reinforcement layer. Therefore, this structure is particularly effective in sufficiently ensuring the strength of a peripheral portion of the through hole 7.

As illustrated in FIGS. 16 and 17, the lead electrode 9 may be provided in the through hole 7 so as to protrude from the main surface 2b of the semiconductor substrate 2. In this case, the light transmissive substrate 5 may be attached to the main surface 2a of the semiconductor substrate 2, with the adhesive layer 6 interposed therebetween, as illustrated in FIG. 16, or the light transmissive substrate 5 may not be attached to the main surface 2a of the semiconductor substrate 2, with the adhesive layer 6 interposed therebetween, as illustrated in FIG. 17.

INDUSTRIAL APPLICABILITY

According to the invention, it is possible to provide a semiconductor device that can reliably ensure an electrical connection through a through hole in a semiconductor substrate while reducing the percentage of the volume of the through holes in the semiconductor substrate.

REFERENCE SIGNS LIST

1: Semiconductor device, 2: Semiconductor substrate, 2a: Main surface (first surface), 2b: Main surface (second surface), 3: First wiring, 3a: Pad portion, 7: Through hole, 7a: First opening, 7b: Second opening, 7c: Inner surface, 8: Second wiring, 9: Lead electrode (bump electrode), 10: Insulating layer, 10a: Opening, 10b: Ssurface, 120: Mounting substrate, 120a: Main surface (third surface), 121: Third wiring, APD: avalanche photodiode.

The invention claimed is:

1. A semiconductor device comprising: a semiconductor substrate that has a first surface and a second surface opposite to each other and in which a through hole to extend from the first surface to the second surface is formed;
   a first wiring that is provided on the first surface and has a portion located above a first opening of the through hole on the a first surface side;
   an insulating layer that is provided on an inner surface of the through hole and the second surface and is continuous through a second opening of the through hole on the a second surface side; and
   a second wiring that is provided on a surface of the insulating layer and is electrically connected to the first wiring in an opening of the insulating layer on the first surface side, wherein the through hole is a vertical hole, and on both sides of a center line of the through hole in a plane including the center line of the through hole, a segment that connects a first point corresponding to an edge of the opening of the insulating layer and a second point corresponding to an edge of the second opening is a first segment, a segment that connects the second point and a third point corresponding to an intersection point between the second opening and the surface of the insulating layer is a second segment, and a segment that connects the third point and the first point is a third segment, a first area of the insulating layer that is located on an inner surface side of the through hole with respect to the first segment is larger than the sum of a second area of the insulating layer that is surrounded by the first segment, the second segment, and the third segment and a third area of the insulating layer that is located on a side opposite the inner surface side of the through hole with respect to the third segment.

2. The semiconductor device according to claim 1, wherein an inclination angle of the surface of the insulating layer at the first point is greater than an inclination angle of the surface of the insulating layer at the third point.

3. The semiconductor device according to claim 1, wherein an average inclination angle of the surface of the insulating layer provided on the inner surface of the through hole is less than an average inclination angle of the inner surface of the through hole.

4. The semiconductor device according to claim 1, wherein, when attention is paid to the regions on both sides of the center line of the through hole in the plane including the center line of the through hole, a distance between the first point and a fourth point corresponding to an edge of the first opening is greater than a width of the opening of the insulating layer.

5. The semiconductor device according to claim 1, wherein the portion of the first wiring is a pad portion that covers the first opening, and
   a distance between the edge of the first opening and the edge of the opening of the insulating layer is greater than a distance between the edge of the first opening and an edge of the pad portion.

6. The semiconductor device according to claim 1, wherein an aspect ratio that is a value obtained by dividing a depth of the through hole by a width of the second opening is equal to or less than 1.

7. The semiconductor device according to claim 1, wherein the insulating layer is made of a resin.

8. The semiconductor device according to claim 1, wherein the surface of the insulating layer provided on the inner surface of the through hole is a continuous surface.

9. The semiconductor device according to claim 1, wherein the surface of the insulating layer provided on the inner surface of the through hole and the surface of the insulating layer provided on the second surface are a continuous surface.

10. The semiconductor device according to claim 1, further comprising:
    a mounting substrate that has a third surface on which a plurality of third wirings are provided, and is provided so as to face the second surface,
    wherein a plurality of avalanche photodiodes that operate in a Geiger mode are provided in the semiconductor substrate,
    the through hole, the first wiring, and the second wiring are provided so as to correspond to each of the plurality of avalanche photodiodes,
    each of the plurality of avalanche photodiodes is electrically connected to the corresponding second wiring through the corresponding first wiring, and
    each of the plurality of third wirings is electrically connected to the corresponding second wiring through a bump electrode.

* * * * *